(12) United States Patent
Watanabe

(10) Patent No.: US 7,335,967 B2
(45) Date of Patent: Feb. 26, 2008

(54) SEMICONDUCTOR DEVICE

(75) Inventor: Hirofumi Watanabe, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 241 days.

(21) Appl. No.: 11/085,505

(22) Filed: Mar. 22, 2005

(65) Prior Publication Data

US 2005/0218478 A1 Oct. 6, 2005

(30) Foreign Application Priority Data

Mar. 23, 2004 (JP) ............................. 2004-084144

(51) Int. Cl.
*H01L 29/00* (2006.01)
(52) U.S. Cl. ........................ 257/536; 257/537; 257/538
(58) Field of Classification Search ................ 257/350, 257/358, 360, 363, 379, 380, 516, 528, 536–538
See application file for complete search history.

(56) References Cited

U.S. PATENT DOCUMENTS 5,004,704 A * 4/1991 Maeda et al. ............... 438/624
5,780,908 A * 7/1998 Sekiguchi et al. ........... 257/383

FOREIGN PATENT DOCUMENTS

| JP | 58-148443 | 9/1983 |
| JP | 61-100956 | 5/1986 |
| JP | 2699559 | 9/1997 |
| JP | 2932940 | 5/1999 |
| JP | 3185677 | 5/2001 |
| JP | 2002-124639 | 4/2002 |
| JP | 2002-261237 | 9/2002 |

* cited by examiner

*Primary Examiner*—Thien F Tran
(74) *Attorney, Agent, or Firm*—Dickstein Shapiro LLP

(57) ABSTRACT

A semiconductor device is provided that includes: a base insulating film; a metal thin-film resistor that is provided on the base insulating film; a lower-layer insulating film that is formed under the base insulating film; and a wiring pattern that is formed on the lower-layer insulating film. In this semiconductor device, the base insulating film is formed on the lower-layer insulating film and the wiring pattern, and connecting holes are formed in the base insulating film located on the wiring patterns. The metal thin-film resistor has at least two belt-like portions and a return portion that continues to the belt-like portions. The belt-like portions are located at a distance from the region on the wiring pattern. The return portion connects at least two belt-like portions in a position at a distance from the region on the wiring pattern. The return portion is formed in a connecting hole via the region on the wiring pattern.

6 Claims, 25 Drawing Sheets

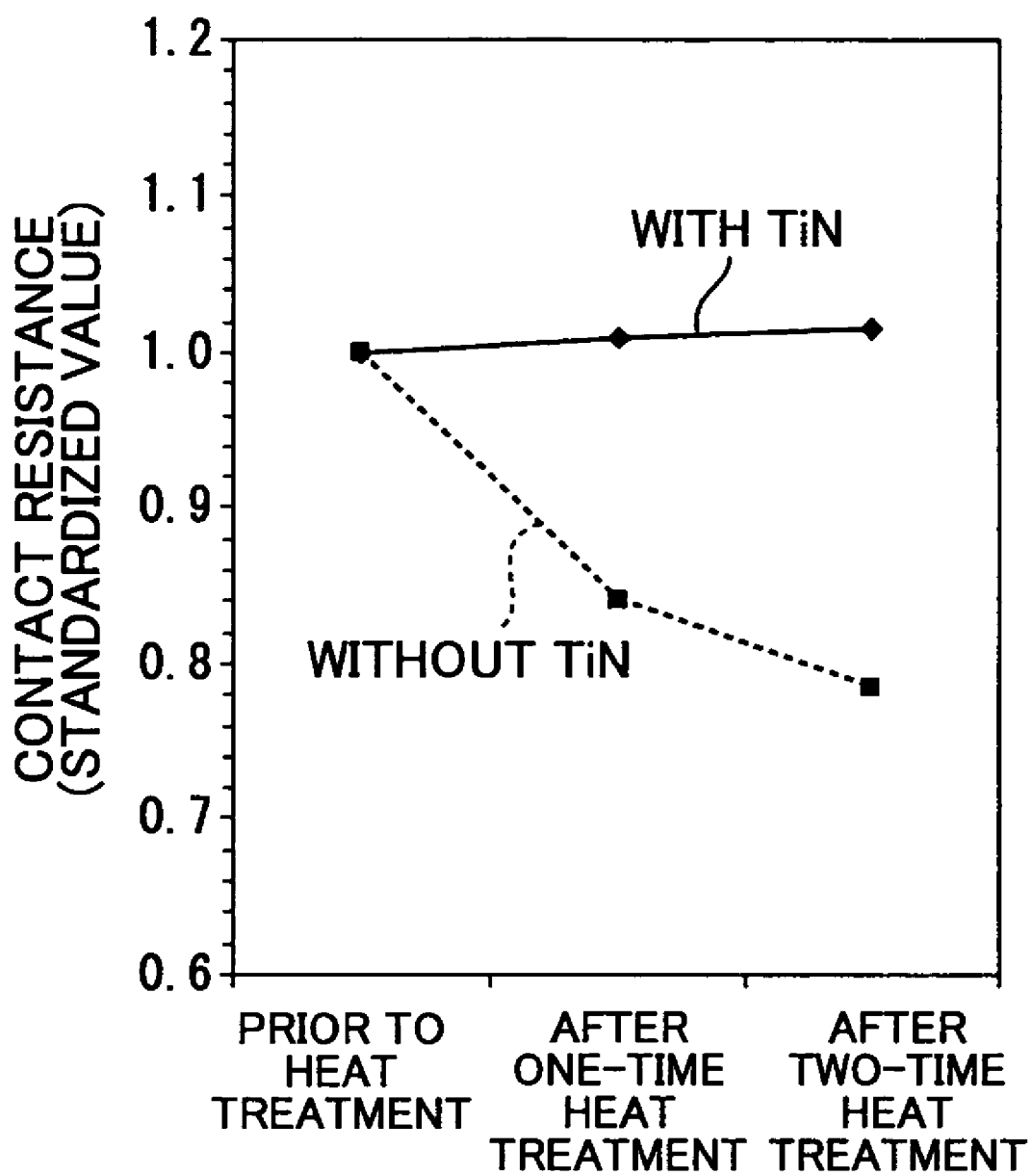

SEMICONDUCTOR DEVICE

BACKGROUND OF THE INVENTION

1. Field of the Invention

The present invention relates to a semiconductor device, and, more particularly, to a semiconductor device that has a metal thin-film resistor on a base insulating film.

2. Description of the Related Art

In analog integrated circuits, resistor devices are often employed as essential components. In recent years, attention has been drawn to resistors that are formed with metal thin films (hereinafter referred to as metal thin-film resistors), as the resistance of a metal thin-film resistor has low temperature dependency (or a small TCR). The materials for the metal thin-film resistors include chromium silicon (CrSi), nickel chromium (NiCr), tantalum nitrogen (TaN), chromium silicide ($CrSi_2$), chromium silicide nitride (CrSiN) and chromium silicon oxide (CrSiO).

To satisfy the requirement for higher integrated analog circuits in a semiconductor device having metal thin-film resistors, each metal thin-film resistor is formed with a small thickness of 1000 Å (angstrom) so as to obtain higher sheet resistance.

Conventionally, there have been the following techniques for establishing electric connection with metal thin-film resistors:

1) The technique of directly connecting a metal wire to each metal thin-film resistor (disclosed in Japanese Laid-Open Patent Application No. 2002-124639, for example);
2) The technique of connecting a metal wire to each metal thin-film resistor via connecting holes that are formed in an interlayer insulating film that is formed after the formation of the metal thin-film resistors (disclosed in Japanese Laid-Open Patent Application No. 2002-261237 and Japanese Patent Publication No. 2699559, for example); and
3) The technique of connecting a metal wire to each metal thin-film resistor layer by connecting the metal wire to a barrier film that is formed on each thin-film resistor layer (disclosed in Japanese Patent Publication Nos. 2932940 and 3185677, for example).

In the following, the techniques 1)-3) of establishing electric connection with metal thin-film resistors are described.

Referring to FIG. 29, the technique 1) of forming a metal wire directly on each metal thin-film resistor is first described.

An interlayer insulating film 5 is formed on a wafer-type silicon substrate 1, after the formation of a device isolating oxide film 3 and a transistor (not shown). A metal thin-film resistor 101 is then formed on the interlayer insulating film 5. A wiring metal film is formed on the entire surface of the interlayer insulating film 5 including the metal thin-film resistor 101. The wiring metal film is patterned by a wet etching technique, so as to form metal wiring patterns 103.

In the general procedures for manufacturing a semiconductor device, a dry etching technique is employed for the etching of the wiring metal film. With the metal thin-film resistor 101 with a smaller thickness existing immediately below the wiring metal film, however, overetching is caused to etch the metal thin-film resistor 101 if a dry etching technique is used. Therefore, a dry etching technique should be avoided, and the metal wiring patterns 103 need to be formed by patterning the wiring metal film by a wet etching technique.

Referring now to FIG. 30, the technique 2) of connecting a metal wire to a metal thin-film resistor via connecting holes that are formed in an interlayer insulating film that is formed after the formation of the metal thin-film resistor is described.

After the formation of a device isolating oxide film 3, an interlayer insulating film 5, and a metal thin-film resistor 101 on a silicon substrate 1, a CVD (chemical vapor deposition) oxide film 105 that is to serve as an interlayer insulating film for the metal wire is formed on the interlayer insulating film 5 including the metal thin-film resistor 101. A resist pattern for forming the connecting holes for the connection with the metal wire is then formed on the CVD oxide film 105. The resist pattern has openings corresponding to both end portions of the metal thin-film resistor 101. With the resist pattern serving as a mask, the CVD oxide film 105 is selectively removed by a wet etching technique, thereby forming the connecting holes 107. After the removal of the resistor pattern, a wiring metal film that is made of AlSCu is formed on the CVD oxide film 105 including the inside of each connecting hole 107. The wiring metal film is patterned to form metal wiring patterns 109.

In the general procedures for manufacturing a semiconductor device, a dry etching technique is used to form the connecting holes 107. If the metal thin-film resistor 101 is thinner than 1000 Å, however, it is difficult to prevent the connecting holes 107 from penetrating the metal thin-film resistor 101. Therefore, the connecting holes 107 need to be formed by a wet etching technique.

Referring now to FIG. 31, the technique 3) of connecting a metal wire to a metal thin-film resistor layer by connecting the metal wire to a barrier film that is formed on the thin-film resistor layer is described.

After the formation of a device isolating oxide film 3, an interlayer insulating film 5, and a metal thin-film resistor 101 on a silicon substrate 1, a refractory metal film that is made of TiW or the like and is to serve as a barrier film for the metal wire is formed on the interlayer insulating film 5 including the metal thin-film resistor 101. A wiring metal film is further formed on the refractory metal film, and the wiring metal film is patterned by a dry etching technique to form metal wiring patterns 111. With the refractory metal film existing under the wiring metal film, the metal thin-film resistor 101 is not etched by a dry etching technique. With the metal wiring patterns 111 serving as a mask, the refractory metal film is selectively removed by a wet etching technique to form a refractory metal film pattern 113. Since the refractory metal film exists immediately above the metal thin-film resistor 101, it is difficult to pattern the refractory metal film by a dry etching technique.

FIG. 32 shows an example of use of metal thin-film resistors. In the example shown in FIG. 32, belt-like metal thin-film resistors 101 are arranged in parallel, and are connected in series with the metal wiring patterns 103. Although the reference numerals in FIG. 32 correspond to the reference numerals in FIG. 29, it is of course possible to arrange belt-like metal thin-film resistors 101 in parallel and connect the metal thin-film resistors 101 with the metal wiring patterns 109 or 111 in the conventional examples shown in FIGS. 30 and 31.

Also, a semiconductor integrated circuit device that is equipped with resistors formed on the uppermost wiring electrode via an insulating film and are connected to the uppermost wiring electrode has been disclosed (in Japanese Laid-Open Patent Application No. 58-148443, for example). This disclosure does not concern metal thin-film resistors.

Referring to FIGS. 33A and 33B, a case where such a structure is applied to metal thin-film resistors is described. FIG. 33A is a plan view, and FIG. 33B is a cross-sectional view, taken along the line X-X of FIG. 33A.

An interlayer insulating film 5 is formed on a silicon substrate 1 having a device isolating oxide film 3 formed thereon, and metal wiring patterns 115 are formed on the interlayer insulating film 5. A base insulating film 131 is formed on the entire surface of the interlayer insulating film 5 including the metal wiring patterns 115. Connecting holes 117 are then formed in the base insulating film 131 on the metal wiring patterns 115 by a photoengraving technique and a dry etching technique. A metal thin film for forming metal thin-film resistors is then formed on the entire surface of the base insulating film 131 including the formation regions of the connecting holes 117. The metal thin film is then patterned into predetermined shapes, so as to form metal thin-film resistors 101.

As shown in FIG. 33B, the lower surfaces of the metal thin-film resistors 101 are electrically connected to the metal wiring patterns 115 in the respective connecting holes 117.

As shown in FIG. 33A, the metal thin-film resistors 101 are connected in series via the metal wiring patterns 115.

Also, as a semiconductor device that is equipped with metal thin-film resistors, an integrated circuit that has metal thin-film resistors mounted on an insulating film of the semiconductor integrated circuit is disclosed (in Japanese Laid-Open Patent Application No. 61-100956, for example). In this structure, the contact between the metal thin-film resistors and the metal wires at the electrode portions of the metal thin-film resistors is located at least a part of the end surface and the upper surface of the end portions of each metal wire.

Referring now to FIGS. 34A and 34B, the technique of establishing contact between the metal thin-film resistors and the metal wires on at least a part of the end surface and the upper surface of the end portion of each metal wire is described. FIG. 34A is a plan view, and FIG. 34B is a cross-sectional view, taken along the line Y-Y of FIG. 34A.

An interlayer insulating film 5 is formed on a silicon substrate 1 having a device isolating oxide film 3 formed thereon, and metal wiring patterns 115 are formed on the interlayer insulating film 5. After a plasma nitride film 119 is formed on the entire surface of the interlayer insulating film 5 including the metal wiring patterns 115, the plasma nitride film 119 is partially removed to partially expose the end surface and the upper surface of the metal wiring patterns 115. A metal thin film for forming metal thin-film resistors is then deposited. The metal thin film is patterned to form metal thin-film resistors 101.

As shown in FIG. 34B, the lower surfaces of the metal thin-film resistors 101 are electrically connected to the upper surface and the side surface of the metal wiring patterns 115.

As shown in FIG. 34A, the metal thin-film resistors 101 are connected in series via the metal wiring patterns 115.

In the case where the lower surfaces of the metal thin-film resistors 101 are electrically connected to the metal wiring patterns 115 via the connecting holes 117, as shown in FIGS. 33A and 33B, the resistance of a metal thin-film resistor 101 is calculated by totaling the resistance of each metal thin-film resistor 101 between the connecting holes 117 including the side surfaces of the connecting holes 117 and the contact resistance between the metal thin-film resistors 101 at both ends and the metal wiring patterns 115.

In the structure shown in FIGS. 33A and 33B, however, a step portion is formed in the base insulating film 131 in the vicinity of the metal wiring patterns 115, due to the side surfaces of the metal wiring patterns 115. The step portion affects the line width of each metal thin-film resistor 101, resulting in an inaccurate resistance value of each metal thin-film resistor 101.

Also, as shown in FIGS. 34A and 34B, in the case where the upper surfaces of the metal thin-film resistors 101 are electrically connected to the upper surfaces and the side surfaces of the metal wiring patterns 115, the resistance of a metal thin-film resistor 101 is calculated by totaling the resistance of each metal thin-film resistor 101 between the metal wiring patterns 115 and the contact resistance between the metal thin-film resistors 101 at both ends and the metal wiring patterns 115.

In the structure shown in FIGS. 34A and 34B, however, a step portion is formed due to the side surfaces of the metal wiring patterns 115. The step portion affects the line width of each metal thin-film resistor 101 in the vicinity of the metal wiring patterns 115. As a result, a desired resistance value of each metal thin-film resistor 101 cannot be obtained in this structure, either.

SUMMARY OF THE INVENTION

A general object of the present invention is to provide a semiconductor device in which the above disadvantages are eliminated.

A more specific object of the present invention is to provide a semiconductor device that is equipped with an integrated circuit including metal thin-film resistors and can have a more accurate resistance value of each metal thin-film resistor, even if the lower surfaces of the metal thin-film resistors are electrically connected to the wiring patterns.

The above objects of the present invention are achieved by a semiconductor device that includes: a base insulating film; a metal thin-film resistor that is provided on the base insulating film; a lower-layer insulating film that is formed under the base insulating film; and a wiring pattern that is formed on the lower-layer insulating film. In this semiconductor device, the base insulating film is formed on the lower-layer insulating film and the wiring pattern, and a connecting hole is formed in the base insulating film located on the wiring pattern. The metal thin-film resistor has at least two belt-like portions and a return portion that continues to the belt-like portions. The belt-like portions are located at a distance from the region on the wiring pattern. The return portion connects at least two belt-like portions in a position at a distance from the region on the wiring pattern, and is formed in the connecting hole via the region on the wiring pattern. This semiconductor device is a first embodiment of the present invention.

In the claims and the specification, the base insulating film that serves as the base film for the metal thin-film resistor may be a single-layer insulating film or a laminated film formed with multi-layer insulating films.

In the case where part of the metal thin-film resistor 101 is formed in the connecting holes 117 formed in the base insulating film 131 on the metal wiring patterns 115, as shown in FIGS. 33A and 33B, the step coverage of the metal thin-film resistor 101 decreases on the inner-wall side surface of the connecting holes 117, especially on the bottom side of each connecting hole 117. As a result, the contact resistance between the metal thin-film resistor 101 and the metal wiring patterns 115 becomes higher and varies in a wider range.

To counter this problem, at least the upper end portion of the connecting hole may have a tapered shape, and an inverse sputtering residue containing at least the materials of the wiring pattern and the base insulating film and Ar may be formed on the inner wall of the connecting hole.

The inverse sputtering residue and the tapered portion at the upper end of the connecting hole can be formed by performing inverse sputtering using Ar gas (hereinafter referred to as "Ar inverse sputtering") after the formation of the connecting hole in the base insulating film.

In the first embodiment, the wiring pattern may be formed with a metal material pattern and a refractory metal film that is formed at least on the upper surface of the metal material pattern.

Also, the wiring pattern may be formed with a polysilicon pattern and a refractory metal film that is formed at least on the upper surface of the polysilicon pattern.

The above objects of the present invention are also achieved by a semiconductor device that includes: a base insulating film; a metal thin-film resistor that is provided on the base insulating film; and a wiring pattern that is formed under the base insulating film. In this semiconductor device, which is a second embodiment of the present invention, the metal thin-film resistor has at least two belt-like portions and a return portion that continues to the belt-like portions. The belt-like portions are located at a distance from the region on the wiring pattern. The return portion connects at least two belt-like portions in a position at a distance from the region on the wiring pattern, and is formed over the wiring pattern.

In the case where a metal thin-film resistor is formed on the metal wiring pattern 115 and the base insulating film, as shown in FIGS. 34A and 34B, part of the metal thin-film resistor 101 is formed to cover the end surfaces and the upper surfaces of the metal wiring patterns 115. However, due to the adverse influence of the step portions formed by the end surfaces of the metal wiring patterns 115, the step coverage of the metal thin-film resistor 101 decreases. As a result, the resistance becomes higher and varies in a greater range, and sometimes the metal thin-film resistor 101 breaks.

To counter this problem, the upper end portion of the wiring pattern may have a tapered shape, and an inverse sputtering residue may be formed on the side surface of the wiring pattern on the side of the base insulating film in the second embodiment.

The inverse sputtering residue and the tapered portion at the upper end of the wiring pattern can be formed by performing Ar inverse sputtering after the formation of the wiring pattern on the base insulating film.

This semiconductor device may further include sidewalls that are made of an insulating material and are formed on the side surfaces of the wiring pattern, and the return portion may be formed over the base insulating film and the wiring pattern via the surfaces of the sidewalls.

Further, an inverse sputtering residue containing at least the material of the sidewalls and Ar may be formed on the surfaces of the sidewalls on the side of the base insulating film.

Such an inverse sputtering residue can be formed by performing Ar inverse sputtering after the formation of the wiring pattern and the sidewalls.

In the second embodiment with the sidewalls, the wiring pattern may be formed with a metal material pattern and a refractory metal film that is formed at least on the upper surface of the metal material pattern.

Also, the wiring pattern may be formed with a polysilicon pattern and a refractory metal film that is formed at least on the upper surface of the polysilicon pattern.

In the second embodiment, the return portion may be designed to intersect the wiring pattern. Here, "the return portion being designed to intersect the wiring pattern" means that part of the return portion extends from the base insulating film on one side of the wiring pattern, onto the base insulating film on the other side of the wiring pattern, via the region above the wiring pattern in the embodiment without the sidewalls. In the embodiment with the sidewalls, it means that part of the return portion extends from the sidewalls on one side of the wiring pattern, onto the sidewalls on the other side of the wiring pattern, via the region above the wiring pattern.

The semiconductor device of the first or second embodiment may further include a metal nitride film that covers the upper surface of the metal thin-film resistor. In this semiconductor device, a metal oxide film may not be formed between the upper surface of the metal thin-film resistor and the metal nitride film.

The film thickness of the metal thin-film resistor may be 5 Å to 1000 Å, more preferably 20 Å to 500 Å.

An example of a semiconductor device to which the present invention is applied is a semiconductor device that includes a dividing resistive circuit that obtains a voltage output through a dividing process using two or more resistance elements, and is capable of adjusting the voltage output by cutting a fuse element. Each of the resistance elements is formed with a metal thin-film resistor in accordance with the present invention.

Another example of a semiconductor device to which the present invention is applied is a semiconductor device that has a voltage detecting circuit including: a dividing resistive circuit that supplies divided voltage by dividing input voltage; a reference voltage generating circuit that supplies reference voltage; and a comparator circuit that compares the divided voltage supplied from the dividing resistive circuit with the reference voltage supplied from the reference voltage generating circuit. Here, the dividing resistive circuit of the voltage detecting circuit has resistance elements that are metal thin-film resistors in accordance with the present invention.

Yet another example of a semiconductor device to which the present invention is applied is a semiconductor device that has a constant voltage generating circuit including: an output driver that controls outputting of input voltage; a dividing resistive circuit that supplies divided voltage by dividing the output voltage; a reference voltage generating circuit that supplies reference voltage; and a comparator circuit that compares the divided voltage supplied from the dividing resistive circuit with the reference voltage supplied from the reference voltage generating circuit, and controls the operation of the output driver in accordance with the comparison result. Here, the dividing resistive circuit of the constant voltage generating circuit has resistance elements that are metal thin-film resistors in accordance with the present invention.

In the first embodiment of the present invention, a semiconductor device includes: a base insulating film; a metal thin-film resistor that is provided on the base insulating film; a lower-layer insulating film that is formed under the base insulating film; and a wiring pattern that is formed on the lower-layer insulating film. In this semiconductor device, the base insulating film is formed on the lower-layer insulating film and the wiring pattern, and a connecting hole is formed in the base insulating film located on the wiring pattern. The metal thin-film resistor has at least two belt-like portions and a return portion that continues to the belt-like portions. The belt-like portions are located at a distance from the region on the wiring pattern. The return portion connects at least two belt-like portions in a position at a distance from the region on the wiring pattern, and is formed in the connecting hole via the region on the wiring pattern. Since the belt-like portions of the metal thin-film resistor are located at a distance from the region on the wiring pattern, the line width of each belt-like portion can be prevented from varying with the step portions in the base insulating film that are caused due to the wiring pattern. Thus, the accuracy in the resistance value of the metal thin-film resistor can be increased.

Furthermore, at least the upper end portion of the connecting hole has a tapered shape, and an inverse sputtering residue containing at least the materials of the wiring pattern and the base insulating film and Ar is formed on the inner wall of the connecting hole. With this structure, the existence of the inverse sputtering residue increases the step coverage of the metal thin-film resistor inside the connecting hole, and the contact resistance between the metal thin-film resistor and the wiring pattern can be stabilized. Also, the tapered portion at the upper end of the connecting hole can prevent overhanging of the metal thin film deposited in the vicinity of the connecting hole, and reduce the adverse influence on the deposition of the metal thin film inside the connecting hole at the time of the formation of the metal thin film for forming the metal thin-film resistor. Thus, the step coverage of the metal thin film, or the step coverage of the metal thin-film resistor can be improved.

Conventionally, a metal thin-film resistor has problems that its resistance varies due to the composition of the base film or the elapsed time since the formation of the base film. As described above, the inverse sputtering residue and the tapered portion at the upper end of the connecting hole can be formed by performing Ar inverse sputtering after the formation of the connecting hole in the base insulating film. The Ar inverse sputtering performed on the base insulating film before the formation of the metal thin film for forming the metal thin-film resistor can achieve the effect of reducing the base film dependency and the variation of the sheet resistance of the metal thin-film resistor with time.

The effect achieved by performing the Ar inverse sputtering on the base film of the metal thin-film resistor is described later in detail.

In the first embodiment, the wiring pattern may be formed with a metal material pattern and a refractory metal film that is formed at least on the upper surface of the metal material pattern. In this structure, the refractory metal film is interposed between the metal thin-film resistor and the metal material pattern. Accordingly, the variation in the contact resistance between the metal thin-film resistor and the metal material pattern can be reduced. Thus, the accuracy of the resistance value can be increased, and higher yield can be achieved. In a structure in which the metal thin-film resistor is in contact with a metal material, the contact resistance greatly varies when thermal treatment is performed at a relatively low temperature of 300° C. to 400° C. With the above described structure, such a problem can also be eliminated.

In the first embodiment, the wiring pattern may be formed with a polysilicon pattern and a refractory metal film that is formed at least on the upper surface of the polysilicon pattern. In this manner, the refractory metal film can be interposed between the metal thin-film resistor and the polysilicon pattern of the wiring pattern, so that the variation in the contact resistance between the metal thin-film resistor and the wiring pattern can be reduced. Thus, the accuracy of the resistance value can be increased, and higher yield can be achieved.

The semiconductor device of the second embodiment of the present invention includes: a base insulating film; a metal thin-film resistor that is provided on the base insulating film; and a wiring pattern that is formed under the base insulating film. In this semiconductor device, the metal thin-film resistor has at least two belt-like portions and a return portion that continues to the belt-like portions. The belt-like portions are located at a distance from the region on the wiring pattern. The return portion connects at least two belt-like portions in a position at a distance from the region on the wiring pattern, and is formed over the wiring pattern. Since the belt-like portions of the metal thin-film resistor are located at a distance from the wiring pattern, the line width of each belt-like portion can be prevented from varying with the step portions formed due to the side surfaces of the wiring pattern, and a more accurate resistance value can be obtained.

Further, the upper end portion of the wiring pattern has a tapered shape, and an inverse sputtering residue is formed on the side surface of the wiring pattern on the side of the base insulating film. The existence of the inverse sputtering residue can increase the step coverage of the metal thin-film resistor in the vicinity of the side surface of the wiring pattern on the side of the base insulating film. Thus, the contact resistance between the metal thin-film resistor and the wiring pattern can be stabilized. Also, the tapered portion formed at the upper end of the wiring pattern can prevent overhanging of the metal thin film deposited in the vicinity of the upper end portion of the wiring pattern, and reduce the adverse influence on the deposition of the metal thin film at the time of the formation of the metal thin film for forming the metal thin-film resistor. Thus, the step coverage of the metal thin film, or the step coverage of the metal thin-film resistor, can be improved.

As described above, the inverse sputtering residue and the tapered portion at the upper end of the wiring pattern can be formed by performing Ar inverse sputtering after the formation of the base insulating film and the wiring pattern. The Ar inverse sputtering performed on the base insulating film before the formation of the metal thin film for forming the metal thin-film resistor can achieve the effect of reducing the base film dependency and the variation in the sheet resistance of the metal thin-film resistor with time.

The effect achieved by performing the Ar inverse sputtering on the base film of the metal thin-film resistor is described later in detail.

This semiconductor device of the second embodiment may further include sidewalls that are made of an insulating material and are formed on the side surfaces of the wiring pattern. In this semiconductor device, the return portion is formed over the base insulating film and the wiring pattern via the surfaces of the sidewalls. In this manner, the step coverage of the metal thin-film resistor can be prevented from deteriorating due to the steep step portions formed by the side surfaces of the wiring pattern. Thus, the resistance of the metal thin-film resistor can be stabilized.

Furthermore, since the metal thin-film resistor is formed over the base insulating film and the wiring pattern via the surfaces of the sidewalls, the series of procedures for forming the connecting hole can be skipped, unlike in the case where electric connection between the metal thin-film resistor and the wiring pattern is established with the connecting hole formed on the wiring pattern. Accordingly, the manufacturing process can be shortened and simplified. Also, a variation in the resistance of the metal thin-film resistor and an increase in the contact resistance with electrodes due to the deterioration of the step coverage of the metal thin-film resistor with the connecting hole can be prevented.

Furthermore, an inverse sputtering residue containing at least the material of the sidewalls and Ar is formed on the surfaces of the sidewalls on the side of the base insulating film. The inverse sputtering residue can be formed by performing Ar inverse sputtering on the base insulating film after the formation of the wiring pattern and the sidewalls. The Ar inverse sputtering performed on the base insulating film before the formation of the metal thin film for forming the metal thin-film resistor can reduce the base film dependency and the variation in the sheet resistance of the metal thin-film resistor with time. The effect achieved by performing the Ar inverse sputtering on the base film of the metal thin-film resistor is described later in detail.

In the second embodiment, the metal thin-film resistor is designed to intersect the wiring pattern. In this manner, it is possible to prevent a variation in the contact region between the metal thin-film resistor and the wiring pattern due to a shift in the overlapping of the wiring pattern and the metal thin-film resistor or the round end portions of the metal thin-film resistor. Thus, stable contact resistance can be obtained.

In the second embodiment with the sidewalls, the wiring pattern is formed with a metal material pattern and a refractory metal film that is formed at least on the upper surface of the metal material pattern. In this manner, the refractory metal film can be interposed between the metal thin-film resistor and the wiring pattern. Accordingly, the variation in the contact resistance between the metal thin-film resistor and the metal wiring pattern can be reduced. Thus, more accurate resistance values can be obtained, and higher yield can be achieved. In a structure in which the metal thin-film resistor is in contact with a metal material, the contact resistance greatly varies when thermal treatment is performed at a relatively low temperature of 300° C. to 400° C. With the above described structure, such a problem can also be eliminated.

In the second embodiment with the sidewalls, the wiring pattern is formed with a polysilicon pattern and a refractory metal film that is formed at least on the upper surface of the polysilicon pattern. In this manner, the refractory metal film can be interposed between the metal thin-film resistor and the wiring pattern. Accordingly, the variation in the contact resistance between the metal thin-film resistor and the wiring pattern can be reduced. Thus, more accurate resistance values can be obtained, and higher yield can be achieved.

Any of the semiconductor devices of the first and second embodiments may further include a metal nitride film that covers the upper surface of the metal thin-film resistor, while a metal oxide film is not formed between the upper surface of the metal thin-film resistor and the metal nitride film. In this manner, the upper surface of the metal thin-film resistor cannot be oxidized. Thus, the resistance of the metal thin-film resistor can be stabilized, and more accurate resistance values can be obtained.

In a semiconductor device equipped with a dividing resistive circuit that obtains a voltage output through a dividing process using two or more resistance elements, and is capable of adjusting the voltage output by cutting a fuse element, the resistance elements of the dividing resistive circuit are formed with metal thin-film resistors that are manufactured in accordance with the present invention. The resistance elements can be stabilized by the metal thin-film resistor of the present invention. Thus, the accuracy of the output voltage of the dividing resistive circuit can be increased.

In a semiconductor device equipped with a voltage detecting circuit that includes: a dividing resistive circuit that supplies divided voltage by dividing input voltage; a reference voltage generating circuit that supplies reference voltage; and a comparator circuit that compares the divided voltage supplied from the dividing resistive circuit with the reference voltage supplied from the reference voltage generating circuit, the dividing resistive circuit includes metal thin-film resistor manufactured in accordance with the present invention. Accordingly, the accuracy of the output voltage of the dividing resistive circuit can be increased. Thus, the accuracy of the voltage detection by the voltage detecting circuit can be increased.

In a semiconductor device equipped with a constant voltage generating circuit that includes: an output driver that controls outputting of input voltage; a dividing resistive circuit that supplies divided voltage by dividing the output voltage; a reference voltage generating circuit that supplies reference voltage; and a comparator circuit that compares the divided voltage supplied from the dividing resistive circuit with the reference voltage supplied from the reference voltage generating circuit, and to control the operation of the output driver in accordance with the comparison result, the dividing resistive circuit includes metal thin-film resistor manufactured in accordance with the present invention. In this manner, the accuracy of the voltage output from the dividing resistive circuit can be increased. Thus, the output voltage of the constant voltage generating circuit can be stabilized.

The above and other objects, features, and advantages of the present invention will become more apparent from the following detailed description taken in conjunction with the accompanying drawings.

BRIEF DESCRIPTION OF THE DRAWINGS

FIG. 9 shows the variations in contact resistance between a metal thin-film resistor and metal wires that are caused by thermal treatment carried out on a sample having refractory metal films left on the bottom surfaces of the connecting holes at the time of the connecting hole formation and a sample having the refractory metal films completely removed, with the ordinate axis indicating the value standardized with the contact resistance value measured prior to the thermal resistance, while the abscissa axis indicating the number of times the thermal treatment is performed;

DESCRIPTION OF THE PREFERRED EMBODIMENTS

The following is a description of embodiments of the present invention, with reference to the accompanying drawings.

Figure 1A:
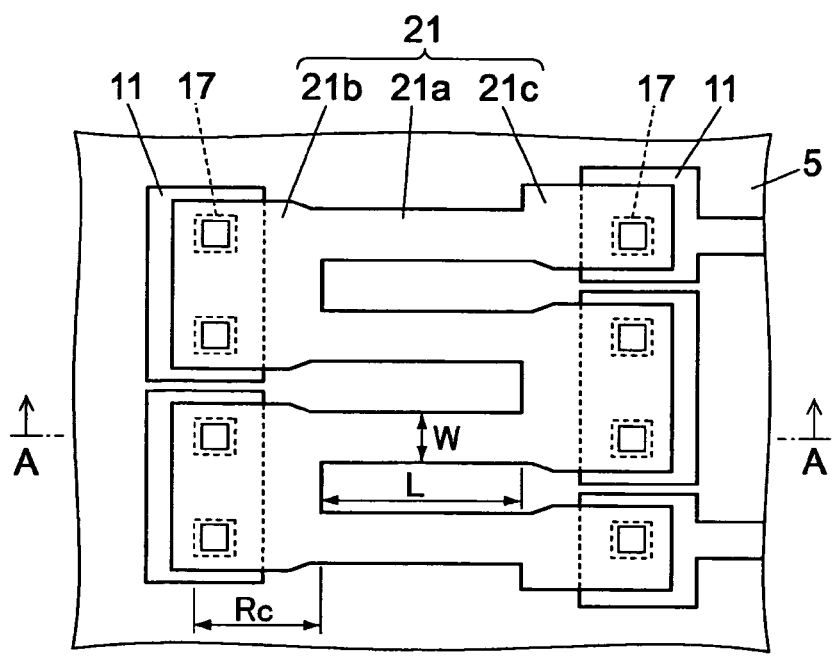
FIG. 1A is a plan view illustrating a part of the formation region of the metal thin-film resistor of an example structure of a first embodiment of the present invention.
Figure 1B:
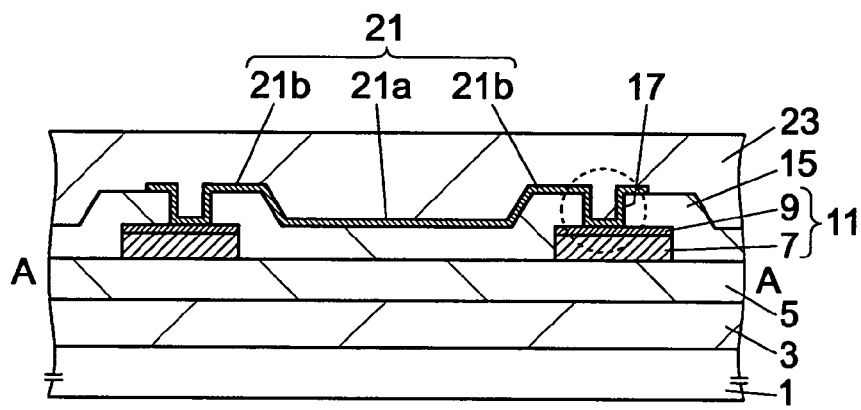
FIG. 1B is a cross-sectional view of the structure, taken along the line A-A of FIG. 1A.
Figure 1C:
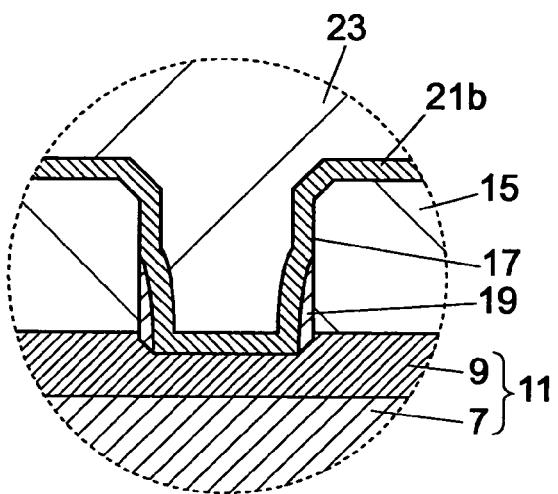
FIG. 1C is an enlarged cross-sectional view of the portion circled by the broken line in FIG. 1B.

FIGS. 1A through 1C illustrate a first embodiment of the present invention. FIG. 1A is a plan view of a part of the region for forming metal thin-film resistors. FIG. 1B is a cross-sectional view, taken along the line A-A of FIG. 1A. FIG. 1C is an enlarged cross-sectional view of the portion circled by a broken line in FIG. 1B. In FIG. 1A, the base insulating film and the passivation film are not shown. In the embodiments described below, a transistor device and a capacitive device are formed on the same substrate, but those devices are not shown in the drawings.

A device isolating oxide film 3 is formed on a silicon substrate 1. An interlayer insulating film (a lower-layer insulating film) 5 that is formed with a BPSG (borophospho silicate glass) film or a PSG (phospho silicate glass) film is formed on the silicon substrate 1 including the region for forming the device isolating oxide film 3. Metal wiring patterns 11 that are formed with metal material patterns 7 and refractory metal films 9 formed on the surfaces of the respective metal material patterns 7 are formed on the interlayer insulating film 5. The metal material patterns 7 are made of AlSiCu, for example. The refractory metal films 9 are made of TiN, for example, and functions as reflection preventing films and barrier films.

A base insulating film 15 that is formed with a plasma CVD oxide film gradually from the lower layer (integrally shown in FIGS. 1B and 1C) is formed on the interlayer insulating film 5 including the region for forming the metal wiring patterns 11. Due to the metal wiring patterns 11, step portions are formed in the base insulating film 15.

Connecting holes 17 corresponding to the returning portions and the end portions of the metal thin-film resistor and the metal wiring patterns 11 are formed in the base insulating film 15.

As shown in FIG. 1C, the bottom surfaces of the connecting holes 17 are formed by removing the corresponding parts of the surfaces of the refractory metal films 9, and the upper end portions of the connecting holes 17 are formed in a tapered fashion. Also, inverse sputtering residues 19 are formed in the inner walls of the connecting holes 17. The tapered portions of the upper ends and the inverse sputtering residues 19 of the connecting holes 17 are not shown in FIG. 1A. The tapered portions of the upper ends and the inverse sputtering portions of the connecting holes 17 are formed by performing Ar inverse sputtering on the base insulating film 15 having the connecting holes 17 formed therein. Therefore, the components of the inverse sputtering residues 19 contain the materials of the refractory metal films 9 and the base insulating film 15 and Ar. More specifically, the components of the inverse sputtering residues 19 contain Ti, N, Si, O, and Ar in this case.

A CrSi thin-film resistor (a metal thin-film resistor) 21 is formed in a crank-like fashion on the base insulating film 15 including the formation regions of the connecting holes 17. Here, the CrSi thin-film resistor includes four belt-like portions 21a, three return portions 21b, and two end portions 21c. Either end of each belt-like portion 21a continues to one of the return portions 21b or one of the end portions 21c. Each of the return portions 21b continues to two of the belt-like portions 21a. Each of the end portions 21c continues to one of the belt-like portions 21a.

The belt-like portions 21a are arranged at a distance from the regions above the metal wiring patterns 11, so that the step portions in the base insulating film formed due to the metal wiring patterns 11 do not affect the line width of each belt-like portion 21a. The return portions 21b and the end portions 21c lie from the end portions of the belt-like portions 21a to the insides of the connecting holes 17 via the step portions in the base insulating film 15 and the regions above the metal wiring patterns 11. In this arrangement, the return portions 21b and the end portions 21c are electrically connected to the metal wiring patterns 11 in the respective connecting holes 17.

A passivation film 23 as an ultimate protection film that includes a silicon oxide film as the lower layer and a silicon nitride film as the upper layer (integrally shown in FIGS. 1B and 1C) is formed on the base insulating film 15 including the formation region of the CrSi thin-film resistor 21.

In this embodiment, the belt-like portions 21 are arranged at a distance from the regions above the metal wiring patterns 11, so that the step portions in the base insulating film formed due to the metal wiring patterns 11 do not affect the line width of each belt-like portion 21a. Accordingly, the line width of each belt-like portion 21a can be prevented from varying with the step portions formed in the base insulating film 15 due to the metal wiring patterns 11. Thus, a more accurate resistance value of the CrSi thin-film resistor 21 can be obtained.

The resistance between the belt-like portion 21a and the metal wiring pattern 11 at each end portion 21c, including the contact resistance to the metal wiring pattern 11, is designed to become equal to the resistance $R_{crank}$ between the belt-like portion 21a and the metal wiring pattern 11 at each return portion 21b, including the contact resistance to the metal wiring pattern 11.

Accordingly, the resistance R of the CrSi thin-film resistor 21 can be calculated using the following equation (1):

$$R = (2 \times R_{crank} + R_{CrSi} \times L/W) \times \text{number of belt-like portions} \quad (1)$$

where W represents the line width of each belt-like portion 21a, L represents the length of each belt-like portion 21a, and $R_{CrSi}$ represents the resistivity.

By calculating the resistance of the CrSi thin-film resistor 21 using the equation (1), a desired resistance value can be more readily obtained with higher accuracy.

In the equation (1), the number of belt-like portions is an integer, and is four in this embodiment.

In this embodiment, the inverse sputtering residues 19 are formed on the inner walls of the connecting holes 17, as shown in FIG. 1B. Accordingly, the step coverage of the CrSi thin-film resistor 21 in the connecting holes 17 is improved. Thus, the contact resistance between the CrSi thin-film resistor 21 and the metal wiring patterns 11 can be stabilized.

Further, the upper ends of the connecting holes 17 are formed in a tapered fashion. Accordingly, the CrSi thin film that is deposited in the vicinities of the upper ends of the connecting holes can be prevented from overhanging when the CrSi thin film is formed to produce the CrSi thin-film resistor 21, and adverse influence on the deposition of the CrSi thin film in the connecting holes 17 can be reduced. Thus, the step coverage of the CrSi thin film, or the step coverage of the CrSi thin-film resistor 21, can be improved.

Figure 29:
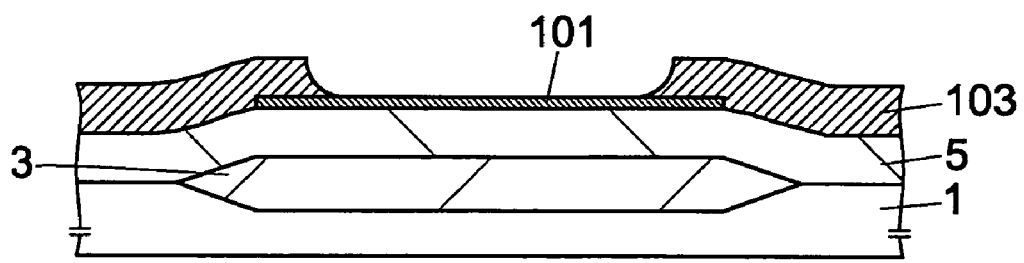
FIG. 29 is a cross-sectional view of a conventional semiconductor device.

By the technique 1) of establishing electric connection with metal thin-film resistors illustrated in FIG. 29, the metal wiring patterns 103 are formed directly on the metal thin-film resistor 101, as described above. However, the metal film for forming the metal wiring pattern 103 cannot be patterned by a dry etching technique. As a result, minute patterning is difficult, and a highly integrated circuit cannot be produced.

Also, the metal thin-film resistors 101 can be easily oxidized. If the metal film for forming the metal wiring patterns 103 is formed, with the surfaces of the metal thin-film resistors 101 being oxidized, desirable electric connection cannot be established between the metal thin-film resistors 101 and the metal wiring patterns 103. In the general procedures for manufacturing a semiconductor device, desirable electric connection with metal wires can be achieved by removing the native oxide film, such as the surface of the silicon substrate, using a hydrofluoric acid solution. However, the metal thin-film resistors 101 are etched by hydrofluoric acid. As a result, the resistance of the metal thin-film resistors 101 might vary, when the oxide film removal is carried out using hydrofluoric acid prior to the metal film for forming the metal wiring patterns 103 are formed.

Figure 30:
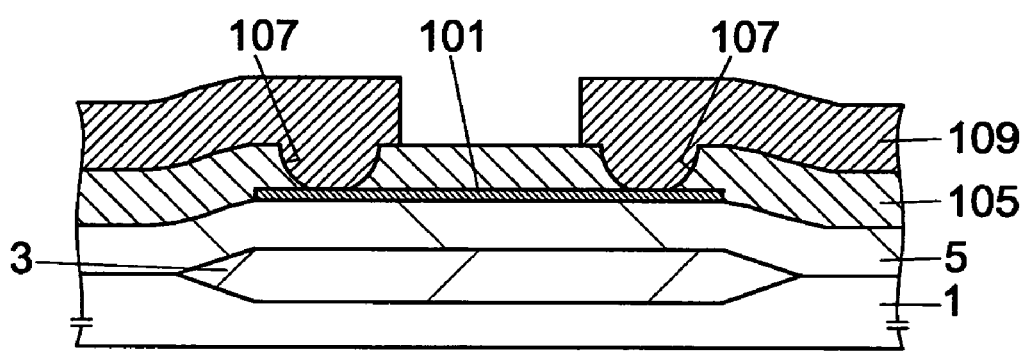
FIG. 30 is a cross-sectional view of another conventional semiconductor device.

By the technique 2) illustrated in FIG. 30, the interlayer insulating film 85 is formed on the metal thin-film resistors 101, so that the metal film for forming the metal wiring patterns 109 can be patterned by a dry etching technique. To form the connecting holes 107 to electrically connect the metal thin-film resistors 101 to the metal wiring patterns 109, however, openings need to be formed by a wet etching technique, as described above. This hinders the production of a highly integrated circuit. Further, a hydrofluoric acid solution is used in the wet etching for forming the connecting holes 107. To protect the metal thin-film resistors 101 from being etched by hydrofluoric acid, it is necessary to add new procedures for forming and patterning a barrier film on the metal thin-film resistors 101, resulting in a larger number of production procedures.

Figure 31:
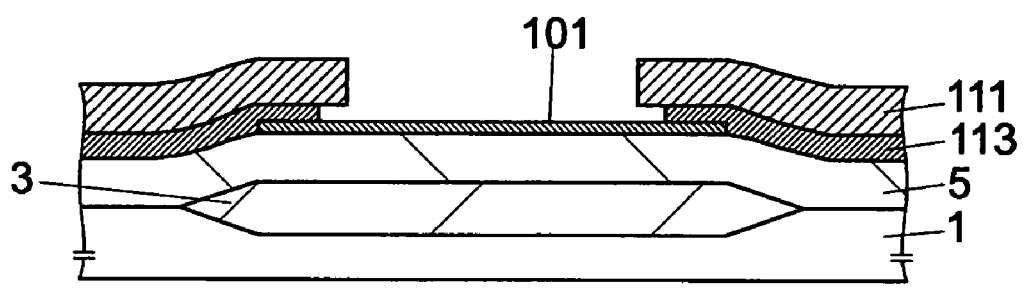
FIG. 31 is a cross-sectional view of yet another conventional semiconductor device.
Figure 32:
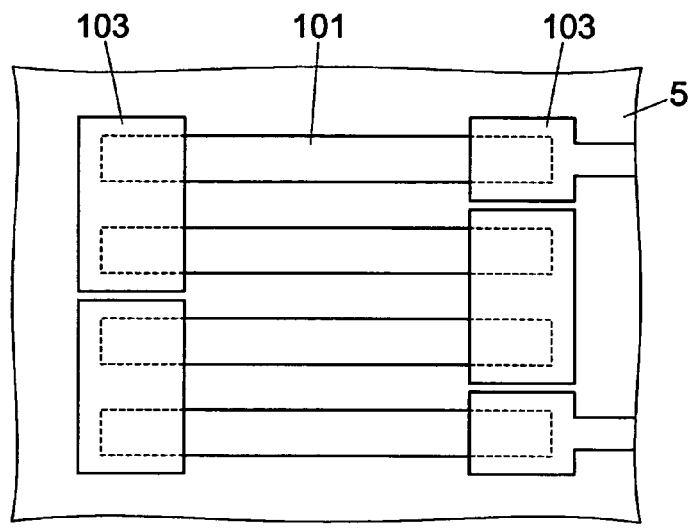
FIG. 32 is a plan view illustrating an example of connected metal thin-film resistors in a conventional semiconductor device.
Figure 33A:
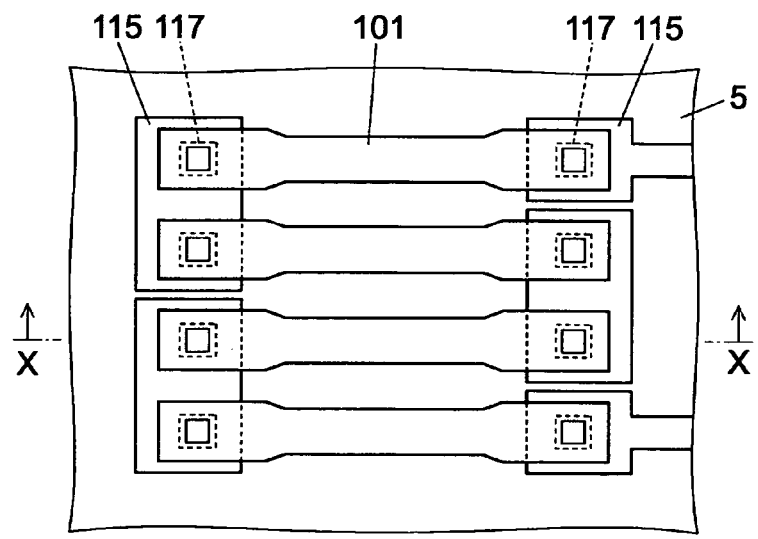
FIGS. 33A and 33B illustrate the problems with yet another conventional semiconductor device.
Figure 33B:
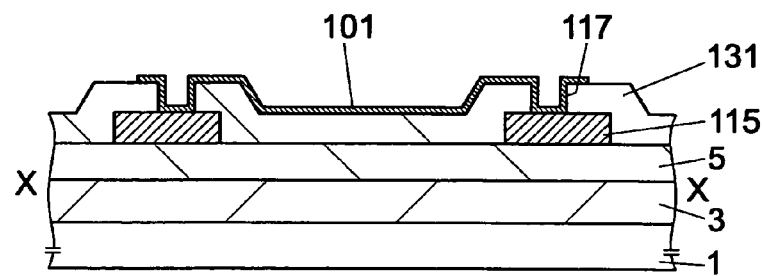
Figure 34A:
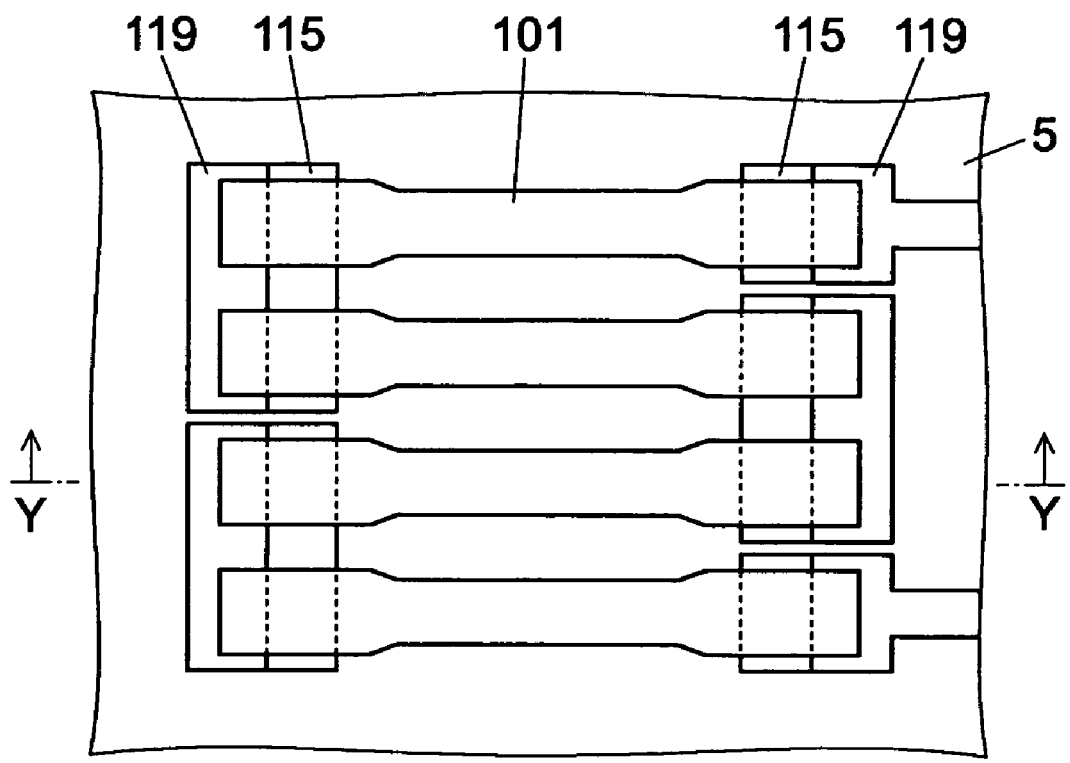
FIGS. 34A and 34B illustrate still another conventional semiconductor device.
Figure 34B:
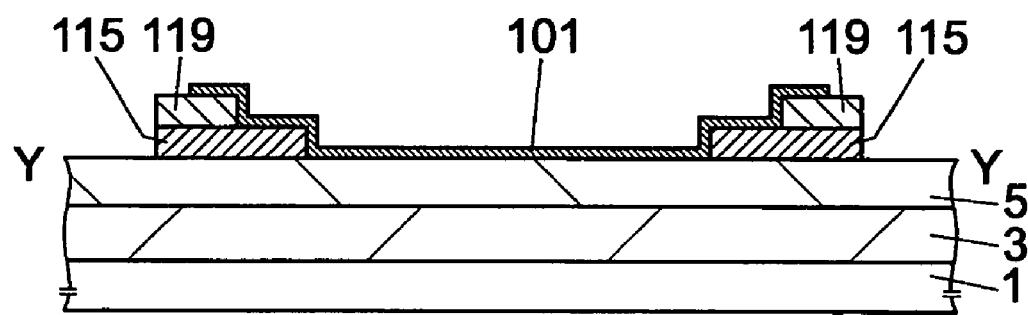

By the technique 3) illustrated in FIG. 31, the metal film for forming the metal wiring patterns 111 can be etched by a dry etching technique, and accordingly, it is not necessary to form connecting holes. However, it is necessary to pattern the refractory metal film by a wet etching technique for forming the refractory metal film patterns 113 that substantially determine the length of each metal thin-film resistor 101. As a result, the refractory metal film patterns 113 are etched in a wider region than the desired etching region, and the substantial lengths of the metal thin-film resistors 101 vary. This leads to wider variations of resistance values, and it becomes difficult to produce a highly integrated circuit.

When the refractory metal film for forming the refractory metal wiring patterns 113 is formed, the surfaces of the metal thin-film resistors 101 have already been oxidized. To obtain desirable electric connection with the refractory metal film patterns 113, it is necessary to remove the oxide film from the surface of each metal thin-film resistor 101, using a hydrofluoric acid solution. However, if the oxide film removal is carried out using hydrofluoric acid prior to the formation of the refractory metal film patterns 113, the resistance values of the metal thin-film resistors 101 might greatly vary.

As described above, by the techniques 1) through 3) illustrated in FIGS. 29 through 31, it is necessary to perform wet etching in one of the production procedures, because the thickness of the metal thin-film resistors are small. This hinders the production of a highly integrated circuit, and causes a wide variation in resistance value.

Further, the metal thin-film resistors can be easily oxidized, and it is difficult to establish desired electric connection with metal wires. Therefore, it is necessary to add a procedure for forming a barrier film especially for the metal thin-film resistors, and to remove the surface oxide film with a hydrofluoric acid solution. As a result, the number of production procedures increases, causing a wide variation in resistance value.

A semiconductor device in accordance with the present invention can prevent these problems. In the following, examples of the method of manufacturing the structure of the above embodiment are described.

FIGS. 2A through 2D are cross-sectional views of the formation region of the metal thin-film resistor, illustrating an example of the method of manufacturing the structure of the first embodiment. FIG. 3 is an enlarged cross-sectional view of the neighboring area of a connecting hole after Ar inverse sputtering is performed by the manufacturing method. In FIGS. 2A through 2D, sidewalls that are formed on the inner walls of the connecting holes, and the tapered portions of the upper ends of the connecting holes are not shown. Referring to FIGS. 1A through 3, the manufacturing method is described in detail.

1) Using an atmospheric-pressure chemical vapor deposition system, for example, the interlayer insulating film 5 that is a BPSG film or a PSG film with a film thickness of approximately 8000 Å is formed on the wafer-like silicon substrate 1 having the device isolating oxide film 3 and a transistor device (not shown) formed thereon. After that, the surface of the interlayer insulating film 5 is flattened through heat treatment such as reflowing.

Using a DC magnetron sputtering device, for example, a wiring metal film that is an AlSiCu film with a film thickness of approximately 5000 Å is formed on the interlayer insulating film 5. Further, a refractory metal film as a conventional reflection preventing film that is a TiN film with a film thickness of approximately 800 Å is continuously formed in a vacuum. Here, the refractory metal film also functions as the barrier film for stabilizing the contact resistance between the metal thin-film resistor and the metal material patterns that are to be formed from the wiring metal films in a later procedure. Therefore, the wiring metal film and the refractory metal film should preferably be formed continuously in a vacuum.

Figure 2A:
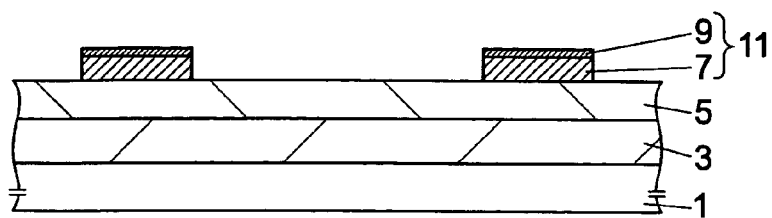
FIGS. 2A through 2D are cross-sectional views illustrating an example of the method of manufacturing the structure of FIGS. 1A through 1C.
Figure 3:
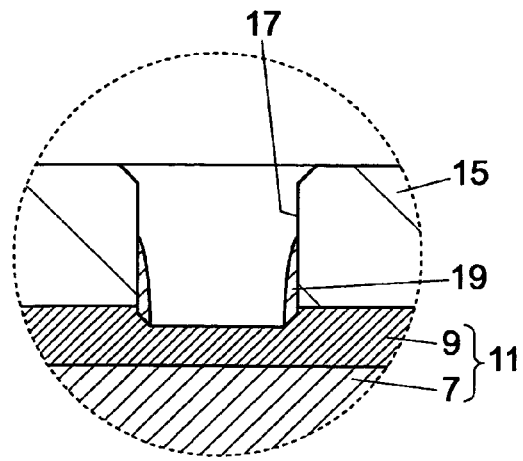
FIG. 3 is an enlarged cross-sectional view illustrating the neighboring area of the connecting holes after Ar inverse sputtering is performed.

By a conventional photoengraving process, the refractory metal film and the wiring metal film are patterned to form the metal wiring patterns 11 that include the metal wiring patterns 7 and the refractory metal films 9, as shown in FIG. 2A. Since the refractory metal films that function as reflection preventing films are formed on the wiring metal film, the thinning and expanding of the resist pattern for specifying the regions for forming the metal wiring patterns 11 can be minimized.

At this stage, the metal thin-film resistor has not been formed yet, and the interlayer insulating film 5 serves as the base film for the metal wiring patterns 11. Accordingly, it is possible to pattern the metal wiring patterns 11 by a dry etching technique with sufficient overetching, and the patterning by a wet etching technique that has caused problems in the prior art is not necessary. Thus, a highly integrated circuit can be produced.

Figure 2B:
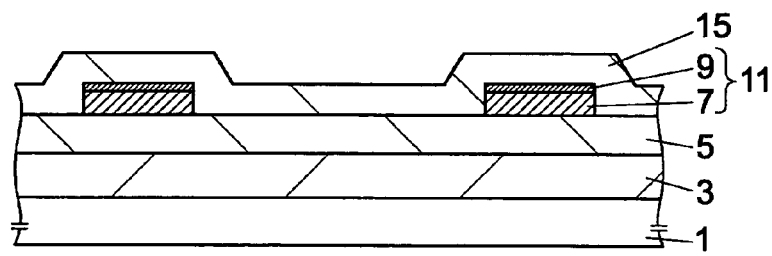

2) By a plasma CVD technique, for example, a plasma CVD oxide film with a film thickness of approximately 6000 Å is formed on the interlayer insulating film 5 including the formation regions of the metal wiring patterns 11, so as to form the base insulating film 15. Step portions are formed in the base insulating film 15, due to the influence of the metal wiring patterns 11, as shown in FIG. 2B.

3) By a conventional photoengraving technique, a resist pattern for forming connecting holes in the base insulating film 15 is formed in conformity with the regions on which the return portions of the metal thin-film resistor are to be formed and the locations of the metal wiring patterns 11.

With a parallel-plate plasma etching device, for example, the base insulating film 15 is selectively removed, with the resist pattern serving as a mask, under such conditions that the RF power is 700 W, the amount of Ar is 500 sccm (standard cc/minute), the amount of $CHF_3$ is 500 sccm, the amount of $CF_4$ is 500 sccm, and the pressure is 3.5 Torr. Thus, the connecting holes 17 are formed in the base insulating film 15. At the bottom of each connecting hole 17, the refractory metal film 9 as a reflection preventing film and a barrier film with a film thickness of approximately 600 Å remains.

Figure 2C:
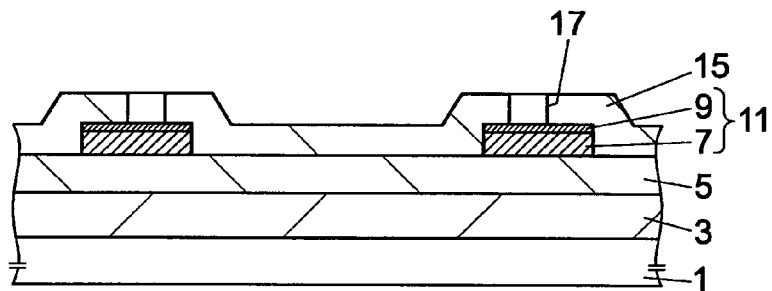

The resist pattern is then removed as shown in FIG. 2C.

After the formation of the connecting holes 17, the byproduct that is formed at the time of etching and is attached to the side walls and the likes of the connecting holes 17 may be removed. Also, to improve the step coverage of the metal thin-film resistor inside the connecting holes 17, the shapes of the connecting holes 17 may be improved by tapered etching through a variation of the etching conditions, or a combined etching technique of a wet etching technique and a dry etching technique.

In the above procedure 3), the plasma etching conditions can be optimized to further reduce the etching rate of the refractory metal films 9 with respect to the etching rate of the base insulating film 15. In this manner, the film thickness of the refractory metal films 9 remaining on the bottoms of the respective connecting holes 17 can be made greater than in the case of the above manufacturing method. Also, the remaining film thickness of the refractory metal films 9 after the formation of the connecting holes 17 can be sufficiently maintained, while the film thickness at the time of the formation of the refractory metal films 9 is kept small. Since the procedure 3) for forming the connecting holes 17 is carried out where the metal thin-film resistor has not been formed yet, it is possible to process the connecting holes 17, without any restriction caused by the small thickness of the metal thin-film resistor. Thus, a minute structure can be achieved using a dry etching technique.

4) In the Ar sputter-etching chamber of a multi-chamber sputtering device, for example, Ar inverse sputtering is performed on the surface of the base insulating film 15 including the insides of the connecting holes 17 in a vacuum, under such conditions that the DC bias is 1250V, the amount of Ar is 20 sccm, the pressure is 8.5 mTorr, and the processing time is 20 seconds. These conditions are the same as the conditions for etching a thermal oxide film by only about 50 Å. The thermal oxide film is formed in a wet atmosphere at 1000° C. The film thickness of the refractory metal films 9 remaining on the bottom surfaces of the connecting holes 17 after the above processing is approximately 500 Å.

Figure 2D:
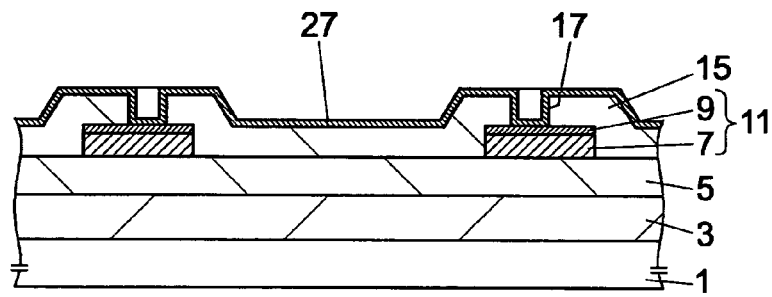

Immediately after the Ar inverse sputtering process, a CrSi thin film (a metal thin film) 27 for forming the metal thin-film resistor is formed in the vacuum. Here, the semiconductor wafer is transported to a sputtering chamber that is equipped with a CrSi target from the Ar sputter-etching chamber. Using the CrSi target, with Si/Cr being 80/20 wt %, processing is performed under the conditions that the DC power is 0.7 KW, the amount of Ar is 85 sccm, the pressure is 8.5 mTorr, and the processing time is 9 seconds. Thus, the CrSi thin film 27 with a film thickness of approximately 50 Å is formed on the entire surface of the base insulating film 15 including the insides of the connecting holes 17, as shown in FIG. 2D.

As described above, before the CrSi thin film 27 for forming the metal thin-film resistor is formed, Ar inverse sputtering is performed on the base insulating film 15 including the insides of the connecting holes 17. By doing so, the inverse sputtering residues 19 that are made of the materials of the refractory metal films 9 and the base insulating film 15 and a material containing Ar can be formed, as well as the tapered portions of the upper ends of the connecting holes 17. In the existence of the inverse sputtering residues 19, the step coverage of the CrSi thin film 27 inside the connecting holes can be improved. With the tapered portions of the upper ends of the connecting holes, the CrSi thin film 27 deposited in the vicinities of the upper ends of the connecting holes 17 can be prevented from overhanging at the time of the formation of the CrSi thin film 27. Accordingly, the adverse influence on the deposition of the CrSi thin film 27 inside the connecting holes 17 can be reduced, and the step coverage of the CrSi thin film 27 can be improved.

By performing the Ar inverse sputtering, the very small quantity of native oxide film formed on the surfaces of the refractory metal films 9 on the bottoms of the connecting holes 17 can be removed, and desired electric connection can be established between the metal wiring patterns 11 and the CrSi thin film 27.

Further, by performing the Ar inverse sputtering, the base film dependency of the CrSi thin-film resistor that is to be formed from the CrSi thin film 27 in a later procedure can be reduced. This effect is later described in greater detail.

5) By a photoengraving process, a resist pattern for specifying the regions for forming the metal thin-film resistor is formed on the CrSi thin film 27. In the resist pattern, the patterns corresponding to the belt-like portions 21a (see FIGS. 1A and 1B) of the CrSi thin-film resistor 21 are formed at a distance from the regions above the metal wiring patterns 11, so that the step portions of the base insulating film 15 that are formed due to the existence of the metal wiring patterns 11 do not affect the line width of each belt-like portion 21a. Thus, the line width of each belt-like portion 21a is prevented from varying with the step portions of the base insulating film 15 due to the metal wiring patterns 11.

Using a RIE (reactive ion etching) device, for example, the CrSi thin film 27 is patterned to form the CrSi thin-film resistor 21, with the resist pattern serving as a mask. The resist pattern is then removed. Since the CrSi thin-film resistor 21 is electrically connected to the metal wiring patterns 11 in the connecting holes 17, it is not necessary to remove the metal oxide film from the surface of the CrSi thin-film resistor 21 using a hydrofluoric acid solution, so as to establish electric connection on the upper surface of the metal thin-film resistor as in the prior art.

By a plasma CVD method, for example, a silicon oxide film and a silicon nitride film as the passivation film 23 are successively formed on the base insulating film 15 including the formation region of the CrSi thin-film resistor 21, as shown in FIGS. 1B and 1C. Here, the manufacture of a semiconductor device is completed.

In the embodiment illustrated in FIGS. 1A through 1C, the CrSi thin-film resistor 21 is formed and is electrically connected to the metal wiring patterns 11 inside the connecting holes 17, after the formation of the metal wiring patterns 11 and the connecting holes 17. Therefore, it is not necessary to perform patterning by a wet etching technique after the patterning of the CrSi thin-film resistor 21.

Further, the contact surface of the CrSi thin-film resistor 21 with the metal wiring patterns 11 is not exposed to the air. Accordingly, desired electric connection between the CrSi thin-film resistor 21 and the metal wiring patterns 11 can be constantly obtained, without performing the surface oxide film removal and the etching preventing barrier film formation on the CrSi thin-film resistor 21.

By the above manufacturing procedures, the CrSi thin-film resistor 21 can be made more minute and have more stable resistance without an increase in the number of procedures, regardless of the film thickness of the CrSi thin-film resistor 21.

Furthermore, it is not necessary to perform patterning by a wet etching technique, after the formation of the metal thin-film resistor. The contact surface of the metal thin-film resistor with the wiring patterns is not exposed to the air, and desired electric connection between the metal thin-film resistor and the wiring patterns can be stably obtained, without the surface oxide film removing operation and the etching preventing barrier film forming operation for the metal thin-film resistor. Accordingly, if the present invention is applied to a semiconductor device that has a metal thin-film resistor with a film thickness of 5 Å to 1000 Å, more preferably 20 Å to 500 Å, the metal thin-film resistor can be made more minute and have more stable resistance, without an increase in the number of procedures.

Especially, with the inverse sputtering residues, the base film dependency of the sheet resistance of the metal thin-film resistor can be reduced, as described later. Accordingly, if the present invention is applied to a semiconductor device having a metal thin-film resistor with the above described thickness, the resistance of the metal thin-film resistor can be stabilized.

Further, with the refractory metal films 9 functioning as barrier films between the CrSi thin-film resistor 21 and the metal material patterns 7, the variation in contact resistance between the CrSi thin-film resistor 21 and the metal wiring patterns can be reduced, and the precision of the resistance and yield can be increased.

Furthermore, the refractory metal films 9 also function as barrier films and reflection preventing films, and can be formed without an increase in the number of manufacturing procedures. Accordingly, the contact resistance between the metal thin-film resistor and the metal wiring patterns can be stabilized, while an increase in production cost is prevented.

Figure 4:
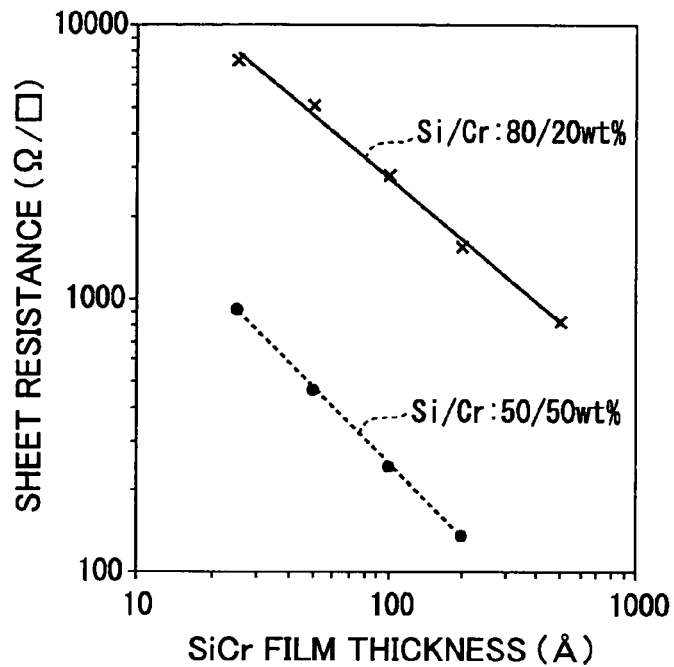
FIG. 4 shows the relationship between the sheet resistance and the film thickness of a metal thin-film resistor formed in accordance with the present invention, with the ordinate axis indicating the sheet resistance ($\Omega/-$) while the abscissa axis indicating the CrSi film thickness (Å)
Figure 5:
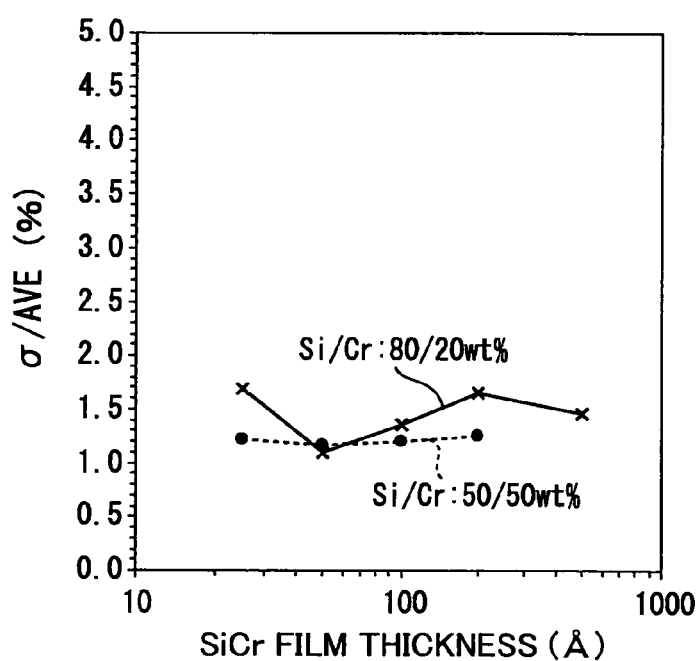
FIG. 5 shows the relationship between the CrSi film thickness and the value ($\sigma$/AVE) obtained by dividing the standard deviation ($\sigma$) of the sheet resistance of the metal thin-film resistor measured at 63 locations in the wafer plane by the average value (AVE), with the ordinate axis indicating $\sigma$/AVE (%) while the abscissa axis indicating the CrSi film thickness (Å)

Referring now to FIGS. 4 and 5, the results of examinations carried out on the characteristics of the metal thin-film resistor that is formed in the same manner as in the above described embodiment.

FIG. 4 illustrates the relationship between the sheet resistance and the film thickness of a metal thin-film resistor. In the graph, the ordinate axis indicates the sheet resistance ($\Omega$/–), while the abscissa axis indicates the CrSi film thickness (Å).

FIG. 5 illustrates the relationship between the CrSi film thickness and the value ($\sigma$/AVE) obtained by dividing the standard deviation ($\sigma$) of the results of sheet resistance measurement conducted on 63 locations in the wafer plane by the average value (AVE). In the graph, the ordinate axis indicates $\sigma$/AVE (%), while the abscissa axis indicates the CrSi film thickness (Å).

The conditions for forming metal thin-film resistors are as follows:

Using a multi-chamber sputtering device, samples of CrSi thin films with thicknesses ranging from 25 Å to 500 Å were produced, while the volume time was adjusted under the conditions that the DC power was 0.7 KW, the amount of Ar was 85 sccm, the pressure was 8.5 mTorr, and the targets of Si/Cr were 50/50 wt % and 80/20 wt %. However, a sample having the ratio of Si/Cr=50/50 wt % with a film thickness of 500 Å was not produced.

Also, using the above multi-chamber sputtering device, the Ar inverse sputtering prior to the formation of a CrSi thin-film was performed under the conditions that the DC bias was 1250 V, the amount of Ar was 20 sccm, the pressure was 8.5 mTorr, and the processing time was 160 seconds. This is equivalent to the process of etching a thermal oxide film, formed in a wet atmosphere at 1000° C., by 400 Å.

In each of the samples, an AlSiCu film with a film thickness of 5000 Å was used as the lower-layer metal wires connecting with the metal thin-film resistor, and a TiN film was not formed on the AlSiCu film at the bottoms of the connecting holes between the AlSiCu film and the CrSi thin film.

The sheet resistance was measured by a two-terminal method by which a voltage of 1V was applied to either end of a metal thin-film resistor among 20 metal thin-film resistors that were belt-like patterns with a width of 0.5 μm and a length of 50 μm arranged at 0.5 μm intervals.

Here, the surface size of each of the connecting holes that connect the metal wires and the CrSi thin-film resistor was 0.6 μm×0.6 μm.

As shown in FIG. 4, the linear characteristics are maintained between the film thickness and the sheet resistance, even at a film thickness of 200 Å or greater or a very small film thickness of 25 Å, regardless of the composition of each target (Si/Cr=50/50 wt % or 80/20 wt %). Thus, it becomes apparent that a metal thin-film resistor with a very small film thickness and minute size that cannot be provided by the prior art can be produced.

As can be seen from FIG. 5 illustrating the variation in sheet resistance at the 63 locations in the wafer plane, the variation in resistance of either of the targets (Si/Cr=50/50 wt % and Si/Cr=80/20 wt %) is hardly affected by the film thickness, and the variation is very small and stable. In view of this, Ar inverse sputtering is performed to form sidewalls in the connecting holes, so that a minute metal thin-film resistor pattern can be stably formed, regardless of the film thickness of the metal thin-film resistor.

Figure 6A:
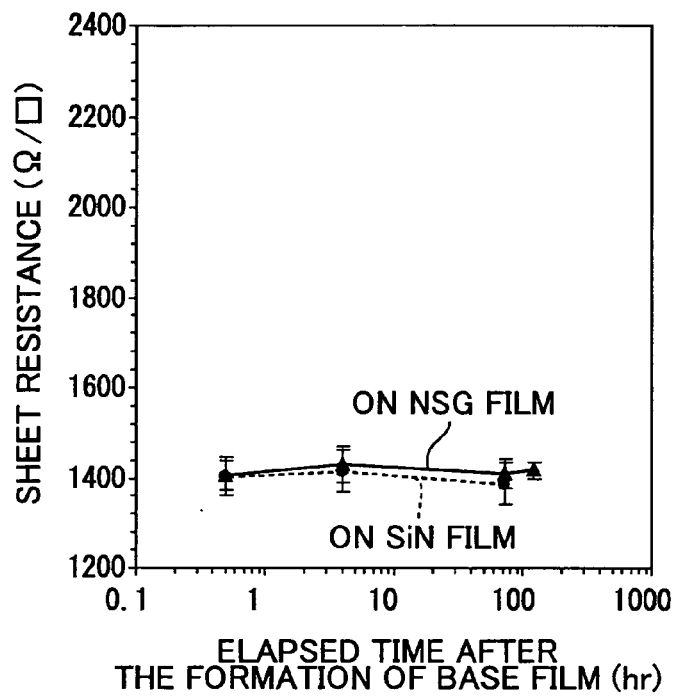
FIG. 6A shows the relationship between the sheet resistance of a CrSi thin-film resistor and the elapsed time since the formation of the base film for the metal thin-film resistor in the case where Ar inverse sputtering is performed before a metal thin film to form the metal thin-film resistor is formed, with the ordinate axis indicating the sheet resistance (Ω/−) while the abscissa axis indicating the elapsed time since the formation of the base film.
Figure 6B:
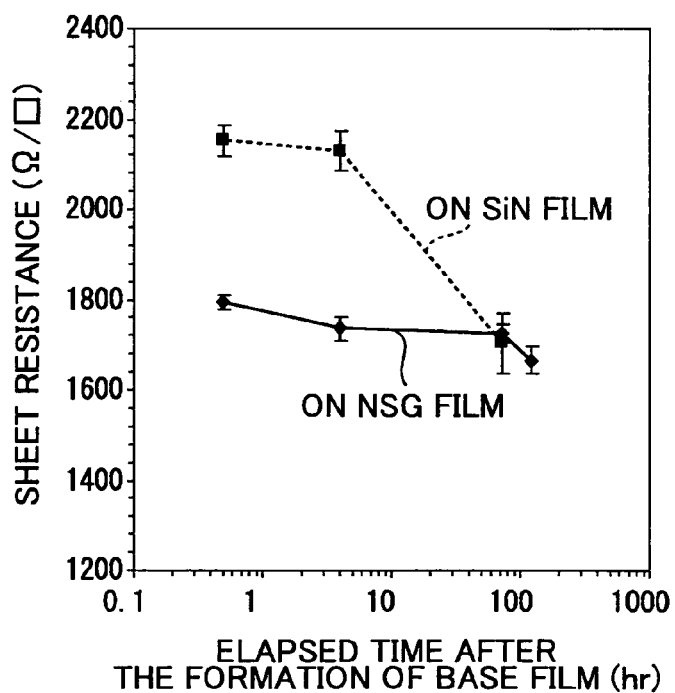
FIG. 6B shows the relationship between the sheet resistance of a CrSi thin-film resistor and the elapsed time since the formation of the base film for the metal thin-film resistor in the case where Ar inverse sputtering is not performed before a metal thin film to form the metal thin-film resistor is formed, with the ordinate axis indicating the sheet resistance (Ω/−) while the abscissa axis indicating the elapsed time since the formation of the base film.

FIGS. 6A and 6B illustrate the relationship between the sheet resistance of the CrSi thin-film resistor and the time that has passed since the base film for the metal thin-film resistor was formed in the cases where Ar inverse sputtering was performed and not performed prior to the formation of the metal thin film for forming the metal thin-film resistor.

FIG. 6A shows the case where the Ar inverse sputtering was performed. FIG. 6B shows the case where the Ar inverse sputtering was not performed. In each of the graphs of FIGS. 6A and 6B, the ordinate axis indicates the sheet resistance (Ω/−), while the abscissa axis indicates the time that has passed since the base film was formed.

As the samples shown in FIGS. 6A and 6B, two silicon wafers that were a plasma SiN film and a plasma NSG (non-doped silicate glass) film were prepared as base films with a thickness of 2000 Å by a plasma CVD technique. Using CrSi thin-film resistors that were formed on these silicon wafers, the sheet resistance of each CrSi thin-film resistor was measured by a four-terminal method.

The plasma SiN film as the base film was formed, using a parallel-plate plasma etching device, under the conditions that the temperature was 360° C., the pressure was 5.5 Torr, the RF power was 200 W, the amount of $SiH_4$ was 70 sccm, $N_2$ was 3500 sccm, and $NH_3$ was 40 sccm.

The plasma NSG film was formed, using a parallel-plate plasma etching device, under the conditions that the temperature was 400° C., the pressure was 3.0 Torr, the RF power was 250 W, the amount of $SiH_4$ was 16 sccm, and $N_2O$ was 1000 sccm.

Using a multi-chamber sputtering device, the CrSi thin-film resistor with a film thickness of 100 Å was formed under the conditions that the Si/Cr ratio of the target was 80/20 wt %, the DC power was 0.7 KW, the amount of Ar was 80 sccm, the pressure was 8.5 mTorr, and the volume time was 13 seconds.

Using the multi-chamber sputtering device, Ar inverse sputtering was performed under the conditions that the DC bias was 1250 V, the amount of Ar was 20 sccm, the pressure was 8.5 mTorr, and the processing time was 80 seconds. This was equivalent to the process of etching a thermal oxide film only by 200 Å. Such a thermal oxide film was formed in a wet atmosphere at 1000° C.

In the case where Ar inverse sputtering was not performed prior to the formation of the CrSi thin film, the sheet resistance greatly varied with the base films (the SiN film and the NSG film), as is apparent from FIG. 6B. Also, it is apparent that the sheet resistance was greatly affected by the time between when the base film was formed and when the CrSi thin film resistor was formed.

On the other hand, in the case where Ar inverse sputtering was performed, the sheet resistance of the CrSi thin-film resistors was hardly affected by the type of the base film and the elapsed time, as can be seen from FIG. 6A.

In view of the above facts, the metal thin film for forming a metal thin-film resistor is formed in a vacuum immediately after Ar inverse sputtering is performed. In this manner, the variation in resistance caused by the elapsed time since the previous procedure and the type of the base film can be greatly reduced.

Figure 7:
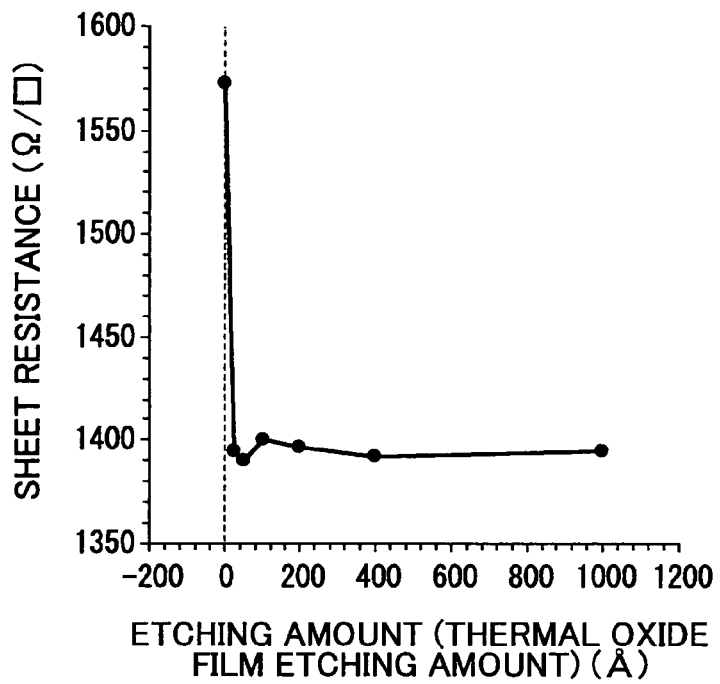
FIG. 7 shows the relationship between the amount of Ar inverse sputtering and the sheet resistance, with the ordinate axis indicating the sheet resistance (Ω/−) while the abscissa axis indicating the etching amount (the thermal oxide film etching amount) (Å)

FIG. 7 illustrates the relationship between the sheet resistance and the amount of Ar inverse sputtering. In the graph of FIG. 7, the ordinate axis indicates the sheet resistance (Ω/−), while the abscissa axis indicates the etching amount (the amount of thermal oxide film etching) (Å). As for the samples used in the experiment shown in FIG. 7, the base films and the CrSi thin-film resistors were plasma NSG films and CrSi thin-film resistors that were formed under the same conditions as the samples of FIGS. 6A and 6B. After Ar inverse sputtering was performed on a plasma NSG film that had been formed 1 hour earlier, a CrSi thin-film resistor was formed on the plasma NSG film. The Ar inverse sputtering was performed under the same conditions as the samples of FIGS. 6A and 6B, except for the etching amount. The etching amounts of thermal oxide films formed in a wet atmosphere were adjusted to be 0 Å (Ar inverse sputtering was not performed), 25 Å, 50 Å, 100 Å, 200 Å, 400 Å, and 1000 Å. The sheet resistance of each CrSi thin-film resistor was then measured by a four-terminal method.

As can be seen from FIG. 7, it became apparent that the resistance of a CrSi thin-film resistor can be stabilized by performing Ar inverse sputtering by the amount equivalent to the film thickness of 25 Å or greater in the thermal oxide film formed in a wet atmosphere. In the experiment of FIG. 7, the greatest thickness that was etched from the thermal oxide film in the Ar inverse sputtering process was 1000 Å. However, even if the etching amount of the thermal oxide film is greater than 1000 Å, the effect of the Ar inverse sputtering should be achieved as long as the base film remains in the formation region of the metal thin-film resistor.

Also, it became apparent that the Ar inverse sputtering has preferable influence not only on each base film but also on the stability of the resistance of each CrSi thin film.

Figure 8:
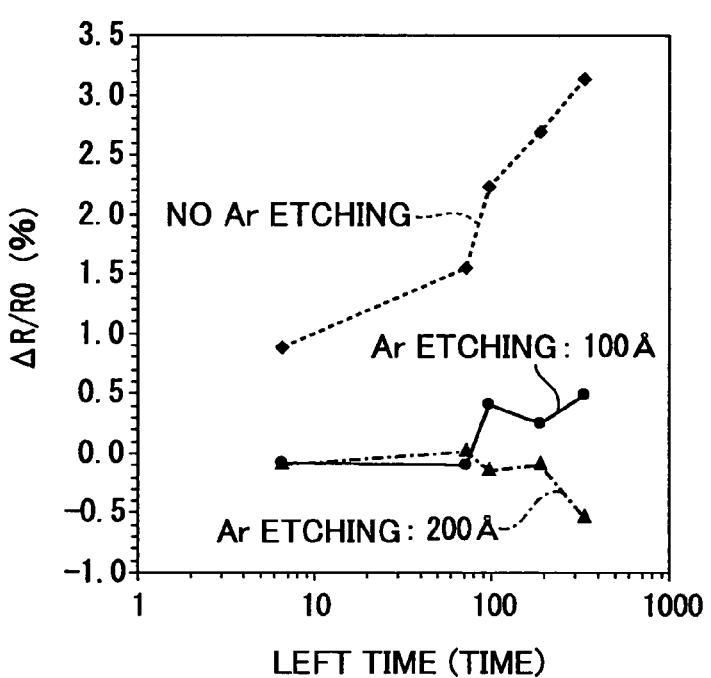
FIG. 8 shows the relationship between the time during which a CrSi thin film for forming a metal thin-film resistor is left in the air at a temperature of 25° C. and a humidity of 45%, and the rate of change (ΔR/R0) in sheet resistance with respect to the sheet resistance measured immediately after the formation of the CrSi thin film, with the ordinate axis indicating ΔR/R0 (%) while the abscissa axis indicating the left time.

FIG. 8 illustrates the relationship between the time during which a CrSi thin-film was left in the air at a temperature of 25° C. and a humidity of 45%, and the rate of change (RΔ/R0) in sheet resistance with respect to the sheet resistance (R0) immediately after the formation of the CrSi thin film. In the graph of FIG. 8, the ordinate axis indicates the rate of change RΔ/R0 (%), while the abscissa axis indicates the time.

As for the samples used in the experiment shown in FIG. 8, the base films and the CrSi thin-film resistors were plasma NSG films and CrSi thin-film resistors that were formed under the same conditions as the samples of FIGS. 6A and 6B.

As for the Ar inverse sputtering, three types of samples were prepared: one without the Ar etching (no Ar etching), one with Ar etching of 100 Å in the thickness of a thermal oxide film for a processing time of 40 seconds (Ar etching: 100 Å), and one with Ar etching of 200 Å in the thickness of a thermal oxide film for a processing time of 80 seconds (Ar etching: 200 Å).

The resistance of the sample without Ar inverse sputtering (no Ar etching) increased as the time passed since the formation, and varied more than 3% in the case where it had been left over 300 hours.

On the other hand, the rate of change in resistance of the sample with Ar inverse sputtering (Ar etching: 100 Å and 200 Å) greatly decreased. After being left for 300 hours or longer, the rate of change in resistance of the sample was within ±1% of the sheet resistance measured immediately after the formation of the sample.

Furthermore, when the sample with the Ar etching of 100 Å is compared with the sample with the Ar etching of 200 Å, it becomes apparent that the influence of the amount of Ar inverse sputtering is small, and only a small amount of etching can provide a sufficient effect.

The effects of the Ar inverse sputtering on the influence of the base film on the sheet resistance and the left time in the air have been described above, with reference to FIGS. 4 through 8. However, these effects are not limited to the CrSi thin-film resistors having the targets with the Si/Cr ratio of 50/50 wt % and 80/20 wt %. The same effects as above were achieved with all CrSi thin films and CrSiN films that were formed with targets having the Si/Cr ratio of 50/50 wt % to 90/10 wt %.

Also, the Ar inverse sputtering technique is not limited to the DC bias sputtering etching technique that was used in the above experiments.

FIG. 9 shows the results of the examination carried out on the variation in contact resistance between metal thin-film resistors and metal wires that is caused by thermal treatment in samples that have the refractory metal films left on the bottoms of the connecting holes at the time of the formation of the connecting holes and the samples that have the refractory metal film completely removed. In the graph of FIG. 9, the ordinate axis indicates the value standardized with the contact resistance prior to the thermal treatment, while the abscissa axis indicates the number of times the thermal treatment was performed.

As the samples used in the experiment shown in FIG. 9, one having the refractory metal films of approximately 500 Å left on the bottoms of the connecting holes, and one having the refractory metal films completely removed were prepared.

The refractory metal films were TiN films.

The CrSi thin-film resistors with a film thickness of 50 Å were formed, under the conditions that the Si/Cr ratio was 80/20 wt %, the DC power was 0.7 KW, the amount of Ar was 85 sccm, the pressure was 8.5 mTorr, and the volume time was 6 seconds.

The Ar inverse sputtering prior to the CrSi thin film formation was performed under the conditions that the DC bias was 1250 V, the amount of Ar was 20 sccm, the pressure was 8.5 mTorr, and the processing time was 160 seconds. This is equivalent to the process of etching a thermal oxide film, formed in a wet atmosphere at 1000° C., by 400 Å.

The surface size of each connecting hole was 0.6 μm×0.6 μm. The contact resistance was measured by a four-terminal method.

For the above samples, 30-minute thermal treatment was additionally performed in a nitrogen atmosphere at 350° C., so as to see how the contact resistance would vary.

Even after thermal treatment was performed twice, the contact resistance of the sample (with TiN) having TiN films on the bottoms of the connecting holes did not change from the contact resistance prior to the thermal treatment. On the other hand, the contact resistance of the sample (without TiN), which had the TiN films completely removed, changed 20% or more after the two-time thermal treatment, compared with the contact resistance prior to the thermal treatment. This proves that TiN films function as barrier films for preventing variations in resistance due to the interaction between the CrSi thin-film and the metal wires.

With the TiN films existing between the CrSi thin-film resistor and the metal wires, the variation in contact resistance caused by the thermal treatment performed in the manufacturing procedures, such as sintering or CVD, can be made very small. Also, a variation in contact resistance caused by thermal treatment such as soldering that is to be performed in the assembling process in a later procedure can be prevented. Accordingly, desired contact resistance can be stably obtained, and the variation in contact resistance before and after the assembling procedure can be prevented. Thus, a more minute structure can be produced, and higher yield can be achieved.

By the manufacturing method illustrated in FIGS. 1A through 3, the metal film and the refractory metal film for forming the metal wiring patterns 11 are continuously formed in a vacuum in the procedure 1). However, the manufacturing method in accordance with the present invention is not limited to that.

In the case where the metal film for forming the metal wiring patterns 11 is formed and exposed to the air, and the refractory metal film is then formed, it becomes difficult to secure the electric conduction between the metal films and the refractory metal films due to the adverse influence of the native oxide film formed on the surface of the wiring metal films. In this case, at the stage of forming the connecting holes 17 in the base insulating film 15 on the metal wiring patterns consisting of the metal material patterns 7 and the refractory metal films 9 formed by patterning the above described metal film and the refractory metal film, the refractory metal films 9 are all removed from the bottom surfaces of the connecting holes 17, so that electric connection can be established between the metal wiring patterns 11 and the CrSi thin-film resistor 21.

Also in the procedure 1), the refractory metal film to function as a reflection preventing film and a barrier film is formed with a film thickness of 800 Å. However, the manufacturing method in accordance with the present invention is not limited to that.

Generally, the refractory metal film as a reflection preventing film is formed with a film thickness of 500 Å or smaller. In the case where the refractory metal films 9 as barrier films are to be left on the bottom surfaces of the connecting holes 17, however, it is preferable to form the refractory metal film with a film thickness of 500 Å or greater, so as to constantly obtain the function as a barrier film. This is to prevent overetching at the formation of the connecting holes 17 (in the procedure 3)), and the thinning of the refractory metal films 9 in the Ar inverse sputtering process at the formation of the metal thin film (in the procedure 4)).

However, it is possible to obtain the function as a barrier film from the refractory metal film by optimizing the etching conditions for forming the connecting holes 17 and the conditions for performing Ar inverse sputtering so as to minimize the thinning of the refractory metal films 9, even if the film thickness of the refractory metal films 9 is 500 Å or smaller.

In the procedure 4), the Ar inverse sputtering is performed immediately before the formation of the CrSi thin film 27. However, in the case where the refractory metal films 9 as barrier films remain on the bottom surfaces of the connecting holes 17, a native oxide film that is as strong as an AlSiCu film is not formed even after the refractory metal films 9 formed with TiN films are exposed to the air. Accordingly, electric connection can be established between the CrSi thin film 27 and the metal wiring patterns 11, even if the Ar inverse sputtering is not performed. In such a case, the tapered portions of the upper ends of the connecting holes and the inverse sputtering residues 19 are not formed. However, it is still preferable to perform the Ar inverse sputtering, because the stability of the resistance of the CrSi thin-film resistor 21 can be increased by performing the Ar inverse sputtering immediately before the formation of the CrSi thin film 27.

In the above embodiment, the passivation film 23 is formed on the CrSi thin-film resistor 21. However, the present invention is not limited to that, and the insulating film to be formed on the CrSi thin-film resistor 21 may be an insulating film of any type, such as an interlayer insulating film to form second metal wiring patterns.

Figure 10A:
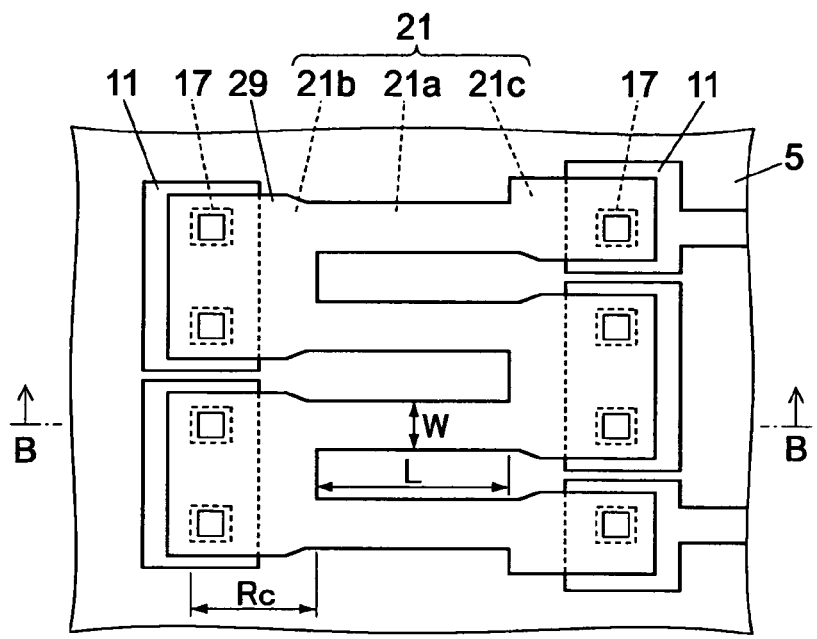
FIG. 10A is a plan view illustrating a part of the formation region of the metal thin-film resistor of another example structure of the first embodiment of the present invention.
Figure 10B:
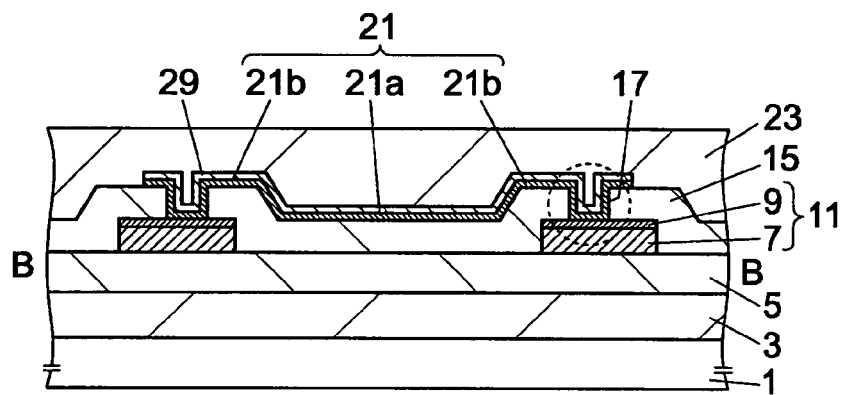
FIG. 10B is a cross-sectional view of the structure, taken along the line B-B of FIG. 10A.
Figure 10C:
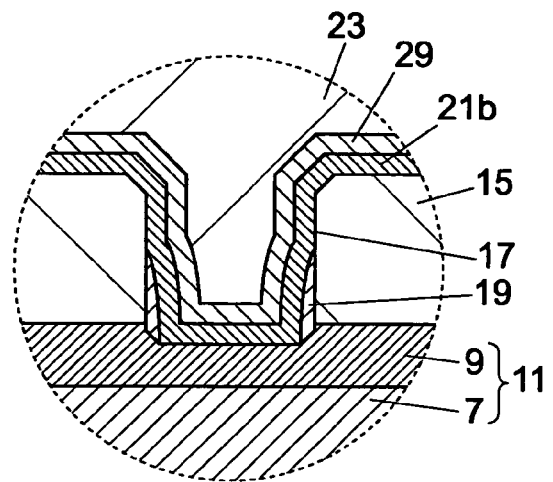
FIG. 10C is an enlarged cross-sectional view of the portion circled by the broken line in FIG. 10B.

FIGS. 10A through 10C illustrate another example of the first embodiment. FIG. 10A is a plan view of a part of the formation region of the metal thin-film resistor. FIG. 10B is a cross-sectional view of the metal thin-film resistor, taken along the line B-B. FIG. 10C is an enlarged cross-sectional view of the portion surrounded by the broken line of FIG. 10B. In FIG. 10A, the base insulating film and the passivation film are not shown. In FIGS. 10A through 10C, the components having the same functions as those shown in FIGS. 1A through 1C are denoted by the same reference numerals as those in FIGS. 1A through 1C, and explanation of them is omitted herein.

A device isolating oxide film 3, an interlayer insulating film 5, metal wiring patterns 11 consisting of metal material patterns 7 and refractory metal films 9, and a base insulating film 15 are formed on a silicon substrate 1. The base insulating film 15 has connecting holes 17 that are formed in conformity with the return portions of the metal thin-film resistor and the metal wiring patterns 11. The inverse sputtering residues 19 are formed on the inner walls of the connecting holes 17. The upper end portions of the connecting holes 17 have tapered shapes (see FIG. 10C).

A CrSi thin-film resistor 21 having belt-like portions 21a, return portions 21b, and end portions 21c is formed on the base insulating film 15 including the formation regions of the connecting holes 17. A CrSiN film (a metal nitride film) 29 is formed on the upper surface of the CrSi thin-film resistor 21. There is not a CrSiO film formed between the CrSi thin-film resistor 21 and the CrSiN film 29.

A passivation film 23 is formed on the base insulating film 15 including the formation regions of the CrSi thin-film resistor 21 and the CrSiN film 29.

Referring to FIGS. 10A through 10C, the method of manufacturing this example structure is described.

By the same procedures as the procedures 1) through 3) illustrated in FIGS. 2A through 2C, the interlayer insulating film 5, the metal wiring patterns 11 consisting of the metal material patterns 7 and the refractory metal films 9, the base insulating film 15, and the connecting holes 17 are formed on the wafer-like silicon substrate 1 having the device isolating oxide film 3 formed thereon.

Using the Ar sputter-etching chamber of a multi-chamber sputtering device, for example, inverse sputtering residues 19 and the tapered portions of the upper ends of the connecting holes 17 are formed by performing Ar inverse sputtering on the surface of the interlayer insulating film 5 in a vacuum, under the same conditions as the conditions for performing the Ar inverse sputtering and forming the CrSi thin film in the procedure 4) illustrated in FIG. 2D. Immediately after the completion of the Ar inverse sputtering, a CrSi thin film for forming a metal thin-film resistor is formed in the same vacuum.

After the formation of the CrSi thin film, a CrSiN film is formed on the CrSi thin film in the same vacuum. For example, using the CrSi target with the Si/Cr ratio of 80/20 wt % used for forming the CrSi thin film, the CrSiN film with a film thickness of approximately 50 Å is formed on the CrSi thin film, under the conditions that the DC power is 0.7 KW, the amount of Ar+N$_2$ (mixed gas of argon and nitrogen) is 85 sccm, the pressure is 8.5 mTorr, and the processing time is 6 seconds. The CrSiN film and the CrSi thin film are then patterned to form a laminated pattern of the CrSiN film 29 and the CrSi thin-film resistor 21.

The passivation film 23 is then formed on the base insulating film 15.

The same effects as the example structure illustrated in FIGS. 1A through 1C can be achieved with the example structure illustrated in FIGS. 10A through 10C.

Further, since the upper surface of the CrSi thin-film resistor 21 is covered with the CrSiN film 29, the upper surface of the CrSi thin-film resistor 21 cannot be oxidized, even if exposed to an atmosphere containing oxygen, such as the air.

Generally, a metal thin film has high reactivity with oxygen. It is known that, if a metal thin film is exposed to the air over a long period of time, the resistance value varies. In the example structure illustrated in FIGS. 10A through 10C, the CrSiN film 29 is formed on the upper surface of the CrSi thin-film resistor 21, so that the resistance of the CrSi thin-film resistor 21 is prevented from varying as a result of the upper surface of the CrSi thin-film resistor 21 being exposed to the air. Here, at the stage of forming the CrSi thin film for forming the CrSi thin-film resistor 21, the electric connection between the CrSi thin film and the wiring patterns 11 has already been established. Accordingly, even if another thin film is formed on the CrSi thin-film resistor 21, the characteristics of the structure are not affected at all.

Figure 11:
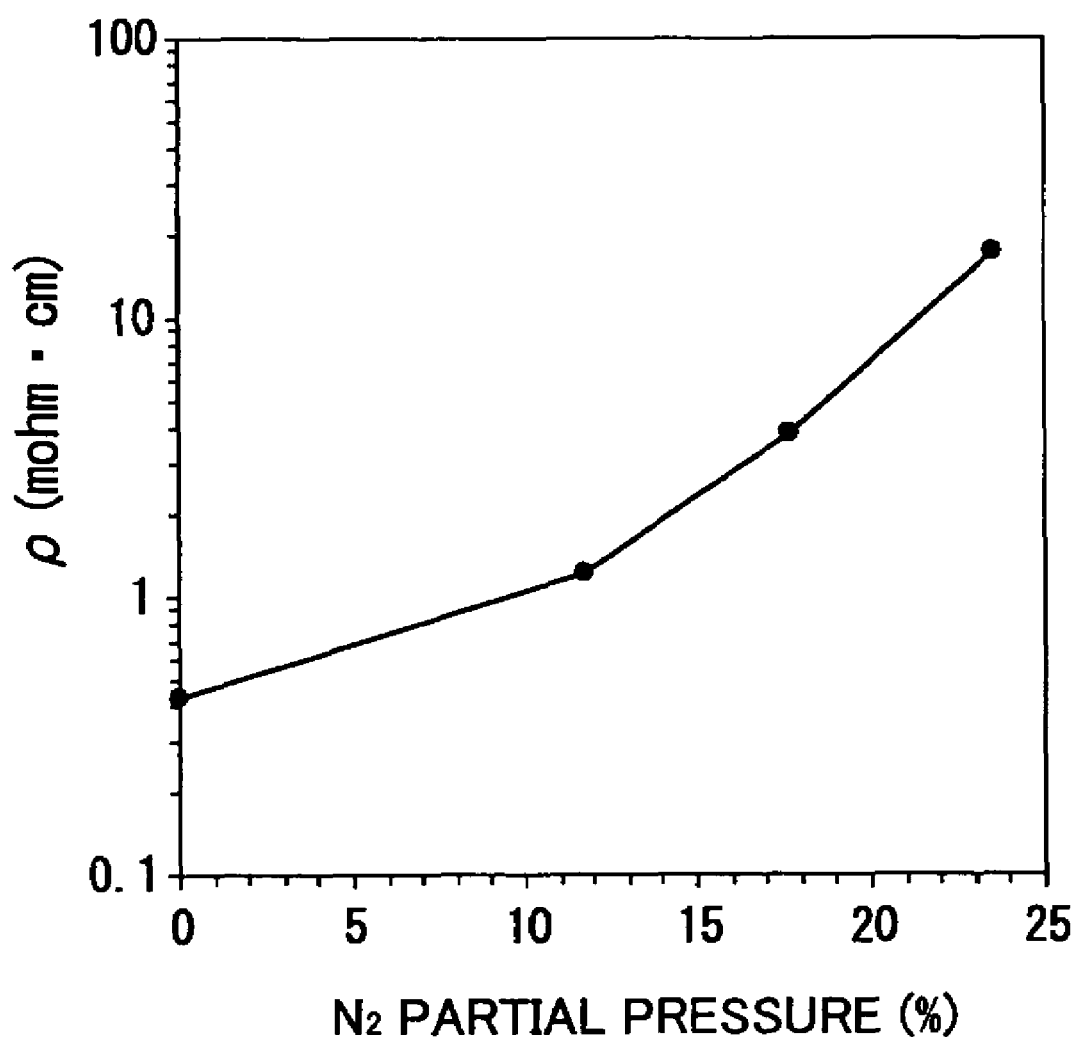
FIG. 11 shows the relationship between the N$_2$ partial pressure of the gas for forming a CrSiN film and the resistivity of the CrSiN film, with the ordinate axis indicating the resistivity ρ (mohm·cm) while the abscissa axis indicating the N$_2$ partial pressure (%)

FIG. 11 shows the relationship between the N$_2$ partial pressure of the gas for forming the CrSiN film and the resistivity of the CrSiN film. In the graph of FIG. 11, the ordinate axis indicates the resistivity ,, (mohm·cm), while the abscissa axis indicates the N$_2$ partial pressure (%). In this example, the CrSiN film was formed by adjusting the N$_2$ partial pressure of Ar+N$_2$ gas, under the conditions that the Si/Cr ratio of the target was 50/50 wt %, the DC power was 0.7 KW, the amount of Ar+N$_2$ was 85 sccm, the pressure was 8.5 mTorr, and the processing time was 6 seconds.

The CrSiN film that was formed by performing reactive sputtering, with the N$_2$ partial pressure being increased by 18% or more, exhibits resistivity ten or more times as high as the resistivity obtained in the case where the CrSiN film was formed with a gas not having N$_2$ at all (where the N$_2$ partial pressure was 0%). Accordingly, if the CrSiN film is formed while the N$_2$ partial pressure is set at 18% or higher, the resistance of the entire CrSi thin-film resistor is determined by the CrSi thin film, even though a CrSiN film is formed directly on the CrSi thin-film resistor. In this manner, the CrSiN film hardly affects the resistance of the CrSi thin-film resistor. Here, the upper limit of the N$_2$ partial pressure is approximately 90%. If the N$_2$ partial pressure is set to 90% of higher, the sputtering speed greatly decreases, resulting in a decrease in productivity.

If the CrSiN film is formed by performing reactive sputtering, with the N$_2$ partial pressure being added by 6% to 11%, the CrSiN film can be used as the metal thin-film resistor.

Although the CrSiN film 29 is provided on the CrSi thin-film resistor 21 in the above described example, it is also possible to provide a CVD-type insulating film, such as a silicon nitride film, on the CrSi thin-film resistor 21. However, a CVD chamber is not attached to a conventional multi-chamber sputtering device. Therefore, to form a CVD-type insulating film on the CrSi thin-film resistor 21 without intermission in a vacuum, new equipment is required, resulting in a great increase in production cost.

In the above described manufacturing method, the CrSiN film 29 is formed on the CrSi thin film 27 that is to be the CrSi thin-film resistor 21. In this manner, the CrSiN film 29 that is to serve as an oxidation-resistant cover film for the CrSi thin-film resistor 21 can be formed without intermission in the vacuum, using an existing multi-chamber sputtering device, instead of a new device.

Figure 12A:
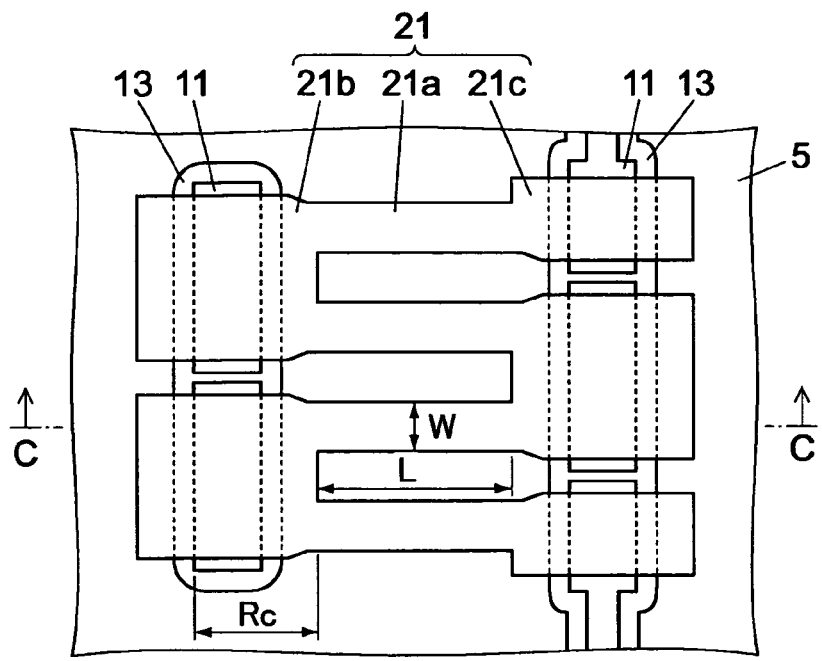
FIG. 12A is a plan view illustrating a part of the formation region of the metal thin-film resistor of an example structure of a second embodiment of the present invention.
Figure 12B:
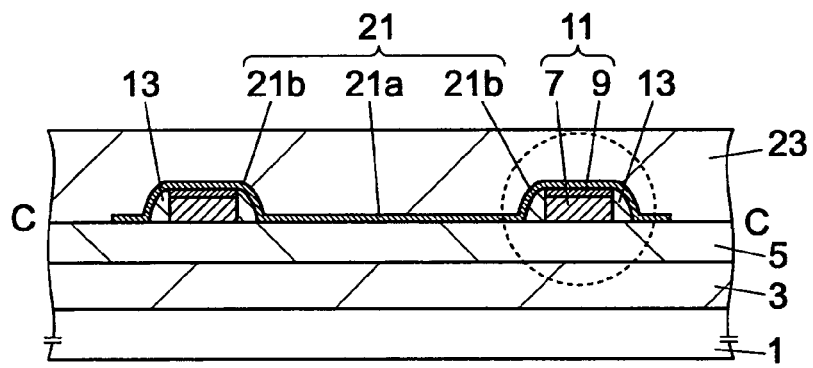
FIG. 12B is a cross-sectional view of the structure, taken along the line C-C of FIG. 12A.
Figure 12C:
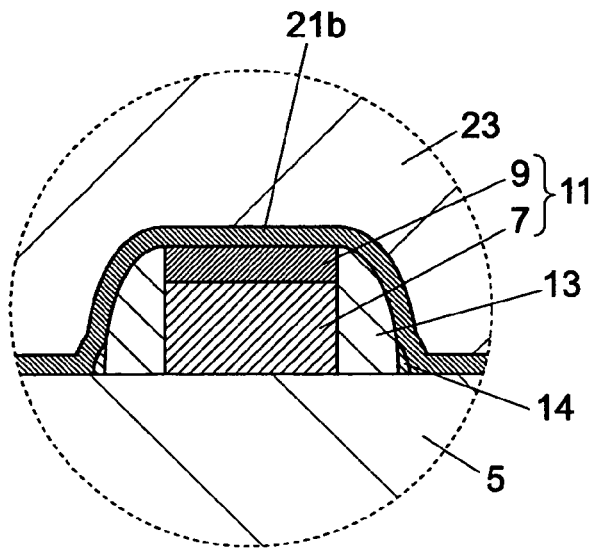
FIG. 12C is an enlarged cross-sectional view of the portion circled by the broken line in FIG. 12B.

FIGS. 12A through 12C illustrate an example structure of a second embodiment of the present invention. FIG. 12A is a plan view of a part of the formation region of a metal thin-film resistor. FIG. 12B is a cross-sectional view of the structure, taken along the line C-C of FIG. 12A. FIG. 12C is an enlarged cross-sectional view of the portion surrounded by the broken line of FIG. 12B. In FIG. 12A, the passivation film is not shown. In FIGS. 12A through 12C, the components having the same functions as those of the foregoing examples are denoted by the same reference numerals as in the foregoing examples, and explanation of them is omitted herein.

A device isolating oxide film 3 is formed on a silicon substrate 1. An interlayer insulating film 5 is formed on the silicon substrate 1 including the formation region of the device isolating oxide film 3. In this example, the interlayer insulating film 5 forms a base insulating film for a CrSi thin-film resistor 21.

Metal wiring patterns 11 formed with metal material patterns 7 and refractory metal films 9 are formed on the interlayer insulating film 5 including the regions corresponding to the return portions 21b and the end portions 21c of the CrSi thin-film resistor 21.

Sidewalls 13 that is made of an insulating material such as CVD oxide film are formed on the side surfaces of the metal wiring patterns 11. Inverse sputtering residues 14 (not shown in FIGS. 12A and 12B) are formed on the surfaces of the sidewalls 13 on the side of the interlayer insulating film 5. The inverse sputtering residues 14 are formed by performing Ar inverse sputtering on the interlayer insulating film 5 after the formation of the metal wiring patterns 11 and the sidewalls 13. The inverse sputtering residues 14 contains at least the materials of the interlayer insulating film 5 and the sidewalls 13 as well as Ar.

The CrSi thin-film resistor 21 that has belt-like portions 21a, return portions 21b, and end portions 21c are formed in a cranked fashion on the interlayer insulating film 5 including part of the formation regions of the metal wiring patterns 11, the sidewalls 13, and the inverse sputtering residues 14. In this example structure, the interlayer insulating film 5 serves as the base insulating film for the CrSi thin-film resistor 21.

The belt-like portions 21a are arranged at a distance from the metal wiring patterns 11, so that the line width is not affected by the metal wiring patterns 11.

The return portions 21b and the end portions 21c extend from the regions continuing to the respective belt-like portions 21a onto the sidewalls 13 formed on side surfaces of the metal wiring patterns 11, the inverse sputtering residues 14, the metal wiring patterns, and the surfaces of the sidewalls 13 and the inverse sputtering residues 14 formed on the opposite side surfaces of the metal wiring patterns 11 from the above. The return portions 21b and the end portions 21c lie on the interlayer insulating film 5. The metal wiring patterns 11 intersect the return portions 21b and the end portions 21c.

The passivation film 23 is formed as the ultimate protection film on the interlayer insulating film 5 including the formation region of the CrSi thin-film resistor 21.

In this example structure, the belt-like portions 21a are arranged at such a distance from the metal wiring patterns 11 that the line width is not affected by the metal wiring patterns 11. Accordingly, the line width of each belt-like portion 21a can be prevented from varying with the metal wiring patterns 11, and the accuracy in the resistance value of the CrSi thin-film resistor 21 can be improved.

As in the example structure described with reference to FIGS. 1A through 1C, the resistance at the end portions 21c between the belt-like portions 21a and the metal wiring patterns 11, including the contact resistance to the metal wiring patterns 11, is designed to be the same as the resistance $R_{crank}$ at the return portions 21c between the belt-like portions 21a and the metal wiring patterns 11, including the contact resistance to the metal wiring patterns 11.

Accordingly, the resistance R of the CrSi thin-film resistor 21 can be calculated using the equation (1), where W represents the line width of each belt-like portion 21a, L represents the length, and $R_{CrSi}$ represents the resistivity. Thus, an accurate resistance value can be readily obtained by calculating the resistance of the CrSi thin-film resistor 21 using the equation (1).

Further, the CrSi thin-film resistor 21 extends from the upper surfaces of the metal wiring patterns 11 onto the interlayer insulating film 5 via the surfaces of the sidewalls 13 and the inverse sputtering residues 14. Accordingly, unlike the case in which electric connection between the metal thin-film resistor and the wiring patterns is established via the connecting holes formed on the wiring patterns, it is not necessary to carry out the series of procedures for forming the connecting holes. Thus, the number of manufacturing procedures can be reduced, and the manufacturing procedures can be simplified. Also, a variation in the resistance of the metal thin-film resistor and an increase in the contact resistance with electrodes are not caused by the deterioration of the step coverage of the metal thin-film resistor due to the existence of the connecting holes.

Further, with the sidewalls 13 formed on the side surfaces of the metal wiring patterns 11, the step coverage of the CrSi thin-film resistor 21 can be prevented from deteriorating due to steep step portions caused by the side surfaces on the metal wiring patterns 11.

Also, as the return portions 21b and the end portions 21c of the CrSi thin-film resistor 21 intersect the metal wiring patterns 11, it is possible to prevent a variation in the contact regions between the metal wiring patterns 11 and the CrSi thin-film resistor 21 due to a shift in the overlapping of the return portions 21b and the end portions 21c on the metal wiring patterns 11 or the round end portions of the return portions 21b and the end portions 21c located opposite from the belt-like portions 21a. Thus, stable contact resistance can be obtained.

Further, since the refractory metal films 9 that function as barrier films are interposed between the CrSi thin-film resistor 21 and the metal material patterns 7, the variation in the contact resistance between the CrSi thin-film resistor 21 and the metal wiring pattern 11 can be reduced, and more precise resistance values and higher yield can be achieved.

Also, the refractory metal films 9 function as barrier films and reflection preventing films. Accordingly, the refractory metal films 9 can be formed without an increase in the number of manufacturing procedures, unlike the prior art. Thus, the contact resistance between the metal thin-film resistor and the wiring patterns can be stabilized, while an increase in the production cost is prevented.

Figure 13A:
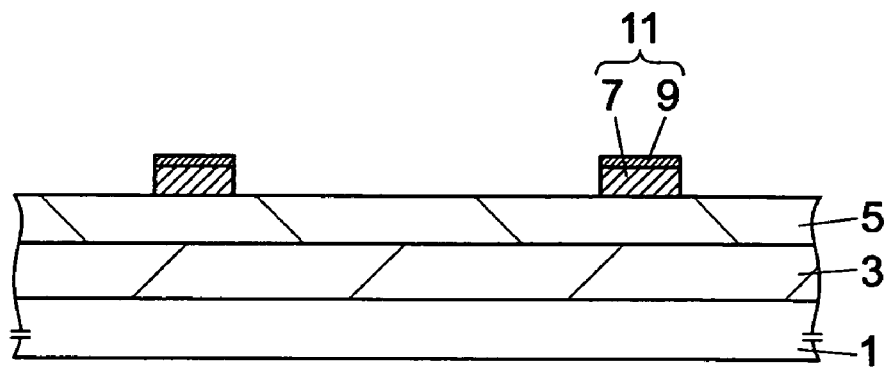
FIGS. 13A through 13C are cross-sectional views illustrating an example of the method of manufacturing the structure of FIGS. 12A through 12C.
Figure 13B:
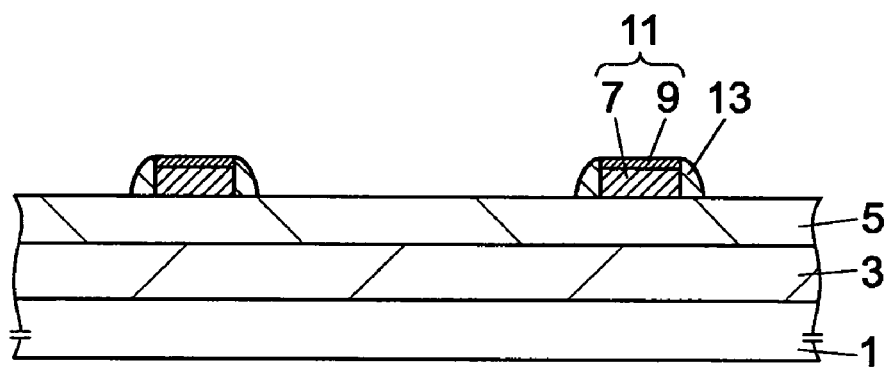
Figure 13C:
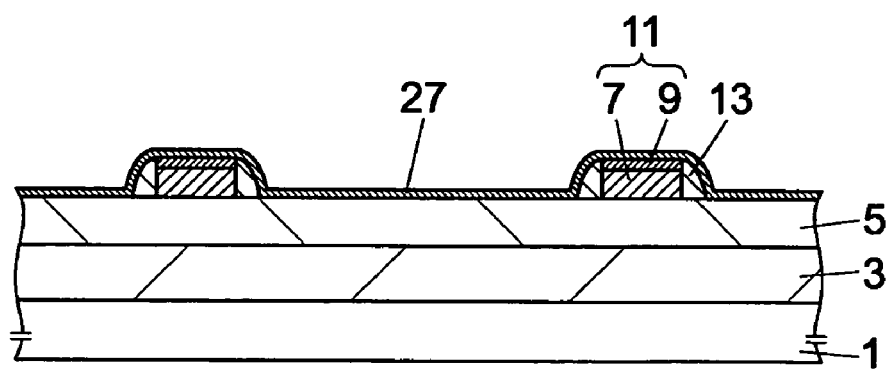

FIGS. 13A through 13C are cross-sectional view illustrating the method of manufacturing this example structure. Referring to FIGS. 12A through 13C, this example structure is described below.

1) In the same manner as in the procedure 1) illustrated in FIG. 2A, the interlayer insulating film 5 is formed on the wafer-like silicon substrate 1 having the device isolating oxide film 3 and a transistor device (not shown) formed thereon. The metal wiring patterns 11 that are formed with the metal material patterns 7 and the refractory metal films 9 are formed on the interlayer insulating film 5 (see FIG. 13B).

2) By a plasma CVD method, for example, a plasma CVD oxide film with a film thickness of approximately 2000 Å is formed on the interlayer insulating film 5 including the formation regions of the metal wiring patterns 11. Etchback is then performed to form the sidewalls 13 that is formed with plasma CVD oxide films on the side surfaces of the metal wiring patterns 11 (see FIG. 13B).

3) Ar inverse sputtering is performed on the interlayer insulating film 5 including the formation regions of the metal wiring patterns 11 and the side walls 13, under the same conditions as the Ar inverse sputtering in the procedure 4) illustrated in FIG. 2D. By the Ar inverse sputtering, the inverse sputtering residues 14 are formed on the surfaces of the sidewalls 13 on the side of the interlayer insulating film 5 (see FIG. 12C).

After the Ar sputter-etching, the CrSi thin film 27 for forming the metal thin-film resistor is formed (see FIG. 13C) under the same conditions as in the process of forming the CrSi thin film in the procedure 4) illustrated in FIG. 2D.

4) By a photoengraving process, a resist pattern for specifying the formation region of the metal thin-film resistor is formed on the CrSi thin film 27. In the resist pattern, the patterns corresponding to the belt-like portions 21a (see FIG. 12A) of the CrSi thin-film resistor 21 are arranged at such a distance from the metal wiring patterns 11 that the line width of each belt-like portion 21a is not affected by the metal wiring patterns 11. Thus, the line width of each belt-like portion 21a is prevented from varying with the metal wiring patterns 11.

Using a RIE device, for example, the CrSi thin film 27 is patterned to form the CrSi thin-film resistor 21, with the resist pattern serving as a mask. The resist pattern is then removed. Here, the CrSi thin-film resistor 21 is electrically connected to part of the metal wiring patterns 11. Therefore, it is not necessary to remove a metal oxide film from the surface of the CrSi thin-film resistor 21, using a hydrofluoric acid solution, so as to establish electric connection on the upper surface of the metal thin-film resistor as in the prior art.

By a plasma CVD technique, for example, a silicon oxide film and a silicon nitride film are continuously formed as the passivation film 23 on the entire surface of the interlayer insulating film 5. Thus, the production of the semiconductor device is completed (see FIGS. 12B and 12C).

As described above, in this example structure, it is not necessary to perform patterning by a wet etching technique after the formation of the CrSi thin-film resistor 21, as in the example structure illustrated in FIGS. 1A through 1C. Further, the contact surface of the CrSi thin-film resistor 21 with the metal wiring patterns 11 is not exposed to the air. Accordingly, stable electric connection can be established between the CrSi thin-film resistor 21 and the metal wiring patterns 11, even though the surface oxide film is not removed from the CrSi thin-film resistor 21, and an etching preventing barrier film is not formed for the CrSi thin-film resistor 21. In this manner, the CrSi thin-film resistor 21 can be formed with a minute structure and can have stable resistance, without an increase in the number of production procedures, regardless of the film thickness of the CrSi thin-film resistor 21.

Further, since the Ar inverse sputtering is performed immediately before the formation of the CrSi thin film for forming the CrSi thin-film resistor 21, the dependency of the CrSi thin-film resistor 21 on the base film can be reduced, as discussed with reference to FIGS. 4 through 8.

Figure 14A:
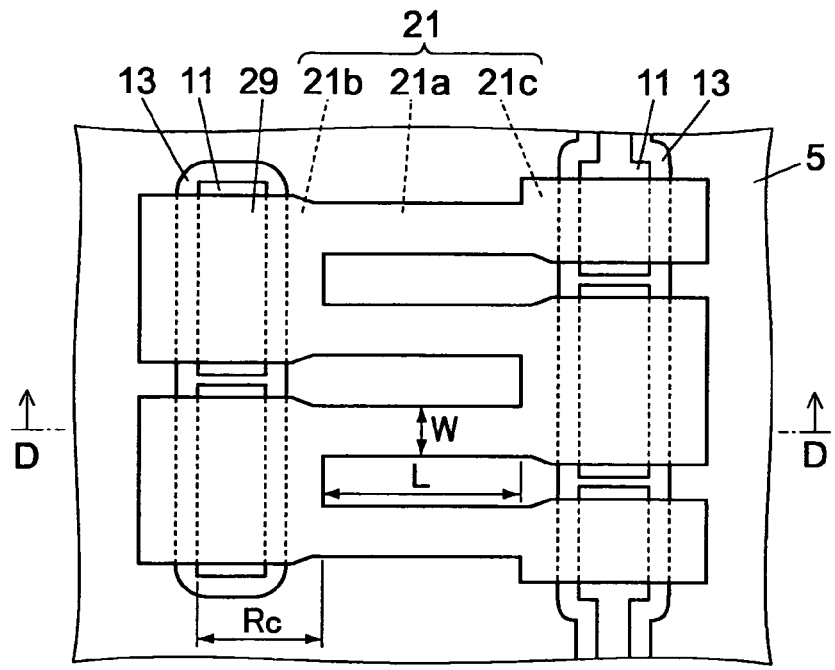
FIG. 14A is a plan view illustrating a part of the formation region of the metal thin-film resistor of another example structure of the second embodiment of the present invention.
Figure 14B:
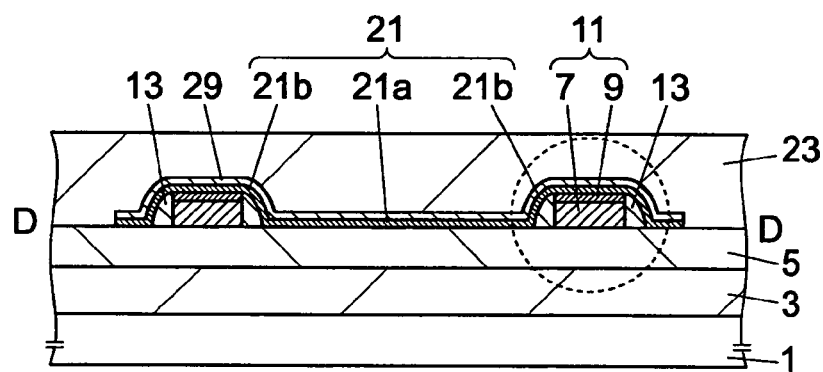
FIG. 14B is a cross-sectional view of the structure, taken along the line D-D of FIG. 14A.
Figure 14C:
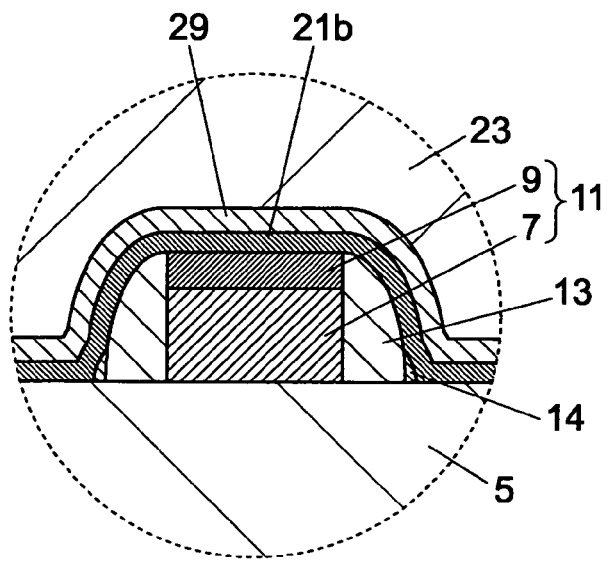
FIG. 14C is an enlarged cross-sectional view of the portion circled by the broken line in FIG. 14B.

FIGS. 14A through 14C illustrate another example structure of a second embodiment of the present invention. FIG. 14A is a plan view of a part of the formation region of a metal thin-film resistor. FIG. 14B is a cross-sectional view of the structure, taken along the line D-D of FIG. 14A. FIG. 14C is an enlarged cross-sectional view of the portion circled by the broken line of FIG. 14B. In FIG. 14A, the passivation film is not shown. In FIGS. 14A through 14C, the components having the same functions as those of the foregoing examples are denoted by the same reference numerals as in the foregoing examples, and explanation of them is omitted herein.

This example structure differs from the example structure illustrated in FIGS. 12A through 12C in that the CrSiN film 29 is formed on the upper surface of the CrSi thin-film resistor 21. There is not a CrSiO film formed between the CrSi thin-film resistor 21 and the CrSiN film 29. The CrSiN film 29 can be formed by the same method as the manufacturing method illustrated in FIGS. 10A through 10C.

In this example structure, the CrSiN film 29 is provided on the upper surface of the CrSi thin-film resistor 21, so as to prevent the upper surface of the CrSi thin-film resistor 21 from being exposed to the air, as in the example structure illustrated in FIGS. 10A through 10C. Accordingly, as well as the same effects as those obtained with the example structure illustrated in FIGS. 12A through 12C, this example structure can achieve the effect that the resistance of the CrSi thin-film resistor 21 can be prevented from varying.

In both examples illustrated in FIGS. 12A through 12C and FIGS. 14A through 14C, the sidewalls 13 are provided on the side surfaces of the metal wiring patterns 11. In the second embodiment of the semiconductor device in accordance with the present invention, however, sidewalls may not be formed on the side surfaces of the metal wiring patterns 11, as shown in FIGS. 15A through 15C and FIGS. 16A through 16C.

In FIGS. 15A through 15C and FIGS. 16A through 16C, reference numeral 31 indicates inverse sputtering residues that are formed after Ar inverse sputtering performed immediately before the formation of the CrSi thin film for forming the CrSi thin-film resistor 21. The inverse sputtering residues 31 contain at least the materials of the refractory metal films 9 and the interlayer insulating film 5, as well as Ar. As a result of the Ar inverse sputtering, the upper end portions of the refractory metal films 9 have tapered shapes. In both example structures illustrated in FIGS. 15A through 15C and FIGS. 16A through 16C, the sidewalls 13 are not provided as in the example structures illustrated in FIGS. 12A through 12C and 14A through 14C. Therefore, the step coverage of the CrSi thin-film resistor 21 cannot be improved by the sidewalls 13. However, the tapered portions of the refractory metal films 9 and the inverse sputtering residues 31 improve the step coverage at the return portions 21b and the end portions 21c of the CrSi thin-film resistor 21. Also, the Ar inverse sputtering is performed immediately before the formation of the CrSi thin film for forming the CrSi thin-film resistor 21, so as to reduce the base-film dependency of the CrSi thin-film resistor 21.

Figure 15A:
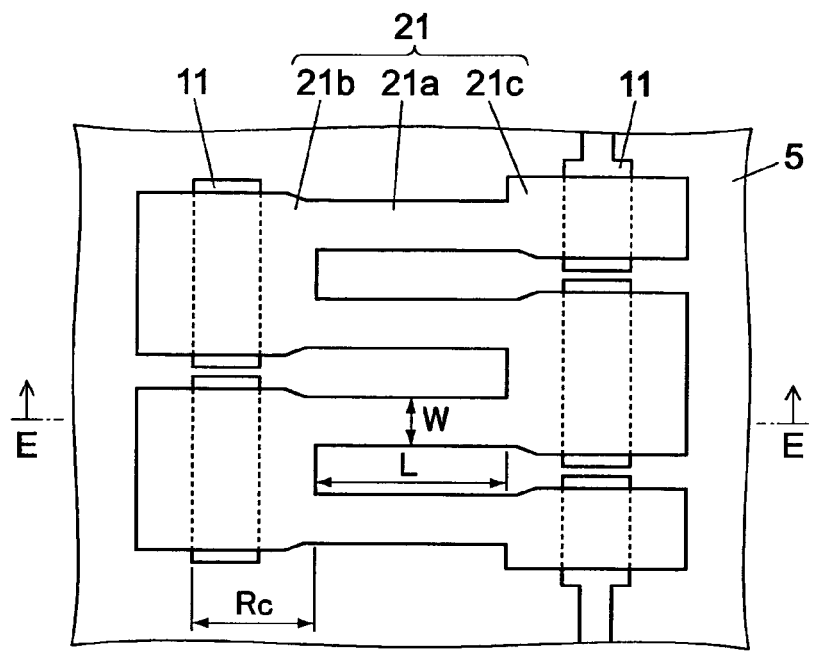
FIG. 15A is a plan view illustrating a part of the formation region of the metal thin-film resistor of yet another example structure of the second embodiment of the present invention.
Figure 15B:
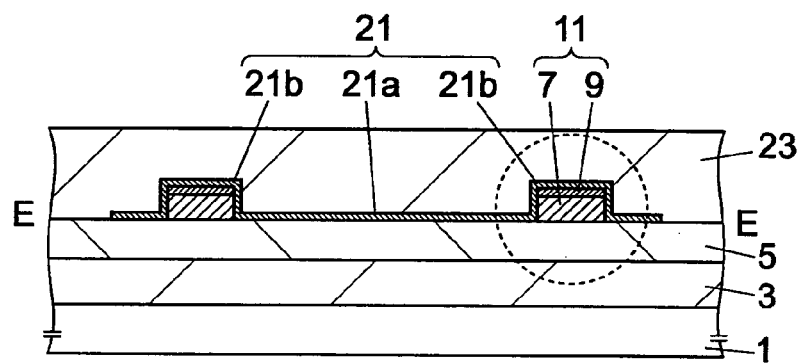
FIG. 15B is a cross-sectional view of the structure, taken along the line E-E of FIG. 15A.
Figure 15C:
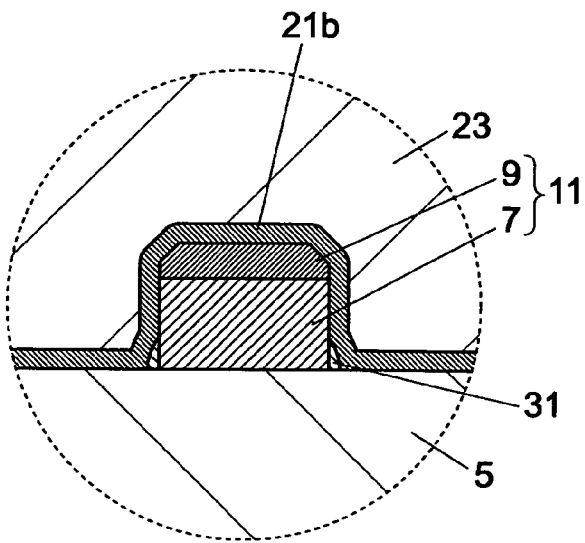
FIG. 15C is an enlarged cross-sectional view of the portion circled by the broken line in FIG. 15B.
Figure 16A:
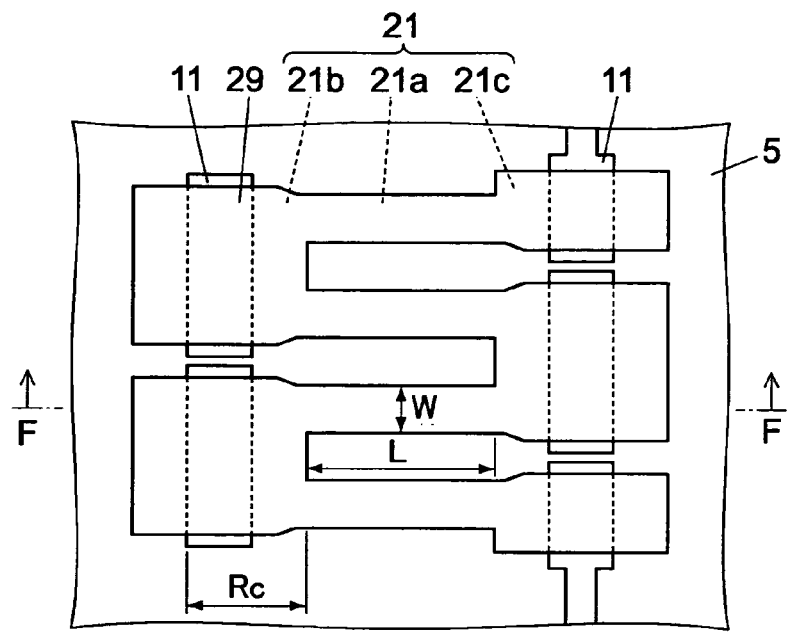
FIG. 16A is a plan view illustrating a part of the formation region of the metal thin-film resistor of still another example structure of the second embodiment of the present invention.
Figure 16B:
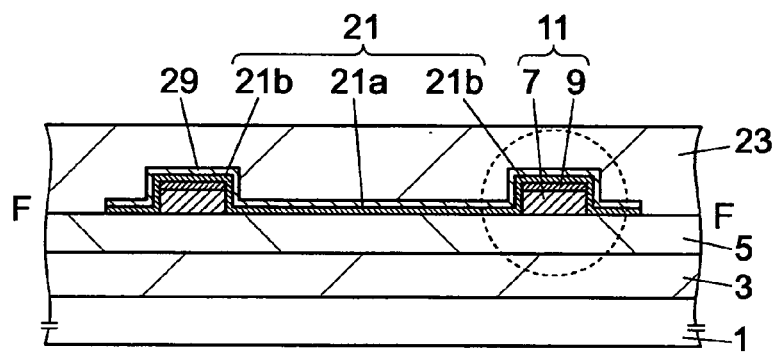
FIG. 16B is a cross-sectional view of the structure, taken along the line F-F of FIG. 16A.
Figure 16C:
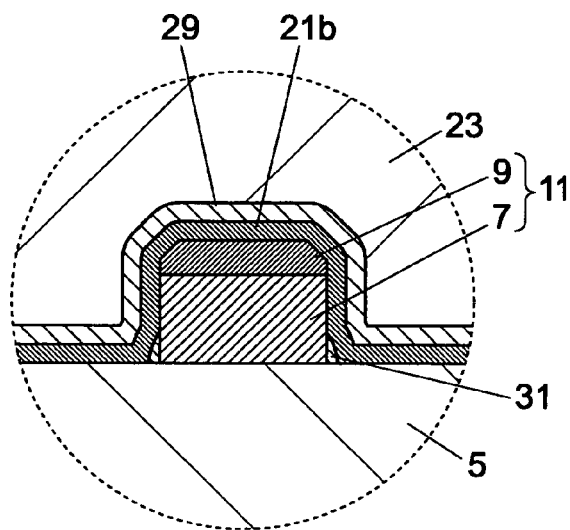
FIG. 16C is an enlarged cross-sectional view of the portion circled by the broken line in FIG. 16B.

The example structure illustrated in FIGS. 15A through 15C can be formed without the procedure for forming the sidewalls 13 among the procedures for manufacturing the example structure illustrated in FIGS. 12A through 12C. Also, the example structure illustrated in FIGS. 16A through 16C can be formed without the procedure for forming the sidewalls 13 among the procedures for manufacturing the example structure illustrated in FIGS. 14A through 14C.

Accordingly, the example structure illustrated in FIGS. 15A through 15C can achieve the same effects as those of the example structure illustrated in FIGS. 12A through 12C. The example structure illustrated in FIGS. 16A through 16C can achieve the same effects as those of the example structure illustrated in FIGS. 14A through 14C. Since part of the CrSi thin-film resistor 21 is in contact with the side surfaces of the metal material patterns 7, it is considered that the effect of the refractory metal films 9 that are provided between the CrSi thin-film resistor 21 and the metal material patterns 7 to improve the stability of the contact resistance is reduced.

In each structure of the first embodiment and the second embodiment, the metal wiring patterns are the uppermost metal wiring patterns.

With this structure, the degree of freedom in design can be increased. For example, the layout of the CrSi thin-film resistor 21 can be changed by changing the arrangement of the CrSi thin-film resistor. 21 and the uppermost metal wiring patterns.

Also, the thin CrSiN film 29 is removed from the upper surface of the CrSi thin-film resistor 21, and the passivation film 23 that is made of an insulating material is formed on the CrSi thin-film resistor 21. Accordingly, the variation in film thickness can be effectively reduced by thinning the insulating material on the CrSi thin-film resistor 21, compared with the case where an insulating film other than the ultimate protection film is formed on the upper surface of the metal thin-film resistor. By doing so, the variation in the laser beam interference with the insulating material on the CrSi thin-film resistor 21 can be reduced when trimming is performed by irradiating the CrSi thin-film resistor 21 with laser beams. Accordingly, the variation in laser energy to be given to the CrSi thin-film resistor 21 can be reduced, and more precise trimming can be performed. Furthermore, the heat radiation capacity can be improved with respect to a temperature increase of the CrSi thin-film resistor 21 caused by the laser irradiation at the time of trimming.

In the above example structure, the metal wiring patterns 11 have the refractory metal films formed on the upper surfaces of the metal material patterns. However, the structure of the present invention is not limited to this, and it is possible to employ metal wiring patterns that do not have refractory metal films formed on the metal material patterns. In such a case, a strong native oxide film is formed on the surfaces of the metal material patterns, if an Al-based alloy is used for the metal material patterns. Therefore, it is preferable to carry out a process of removing the native oxide film from the surfaces of the metal material patterns at the bottoms of the connecting holes, prior to the formation of the metal thin film for forming the metal thin-film resistor after the formation of the connecting holes. The native oxide film removing process may also be performed together with the Ar inverse sputtering process for restricting the variation in resistance of the metal thin-film resistor with time. Also, the material for the metal wiring patterns is not limited to a material containing an Al-based alloy, but it is possible to employ metal wiring patterns made of some other metal material such as Cu wirings formed by the so-called damascene method.

Although TiN films are employed as the refractory metal films 9 formed on the upper surface of the metal material patterns in the above described examples, the material for the refractory metal films 9 is not limited to that. For example, refractory metal films that are made of TiW or WSi may be employed.

Also in the above described examples, the present invention is applied to semiconductor devices each having single-layer metal wiring patterns. However, the present invention is not limited to that, and it is possible to apply the present invention to a semiconductor device with a multi-layer metal wiring structure having multi-layer metal wiring patterns. In such a case, the metal wires provided under the metal thin-film resistor to establish electric connection with the metal thin-film resistor may be located as metal wiring patterns in any layer position.

Also in the above described examples, the metal wiring patterns 11 consisting of the metal material patterns 7 and the refractory metal films 9 are employed as the wiring patterns for establishing electric connection with the CrSi thin-film resistor 21. However, the present invention is not limited to that, and it is also possible to employ polysilicon wiring patterns that include polysilicon patterns.

Figure 17A:
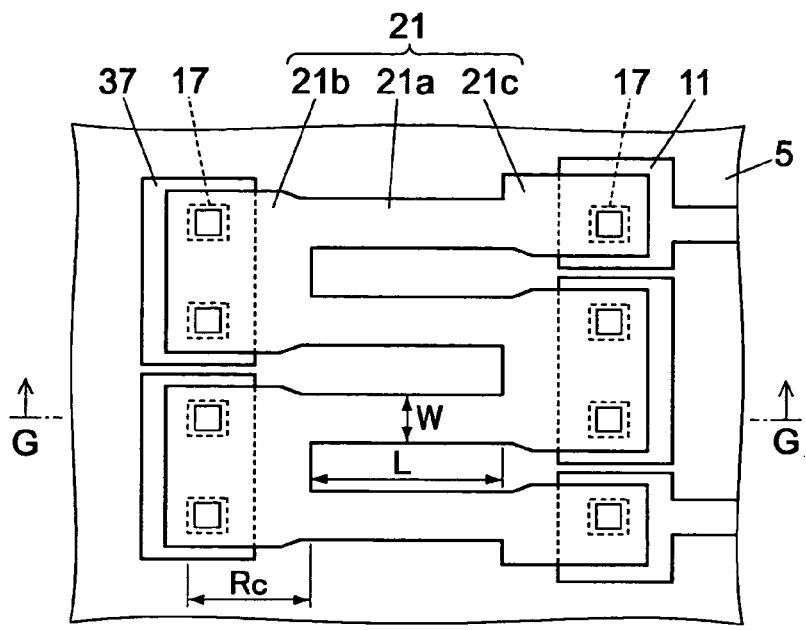
FIG. 17A is a plan view illustrating a part of the formation region of the metal thin-film resistor of yet another example structure of the first embodiment of the present invention.
Figure 17B:
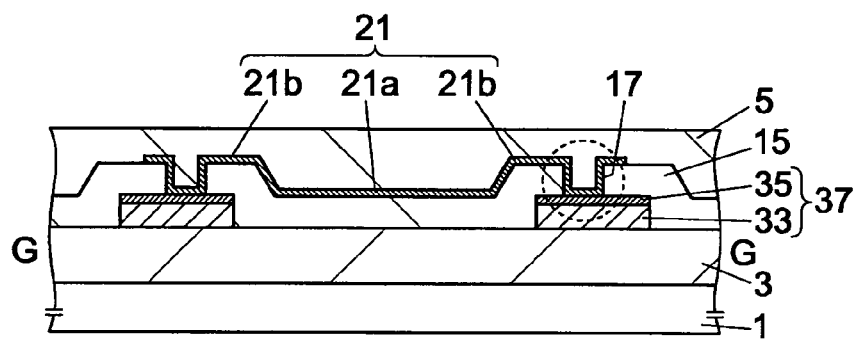
FIG. 17B is a cross-sectional view of the structure, taken along the line G-G of FIG. 17A.
Figure 17C:
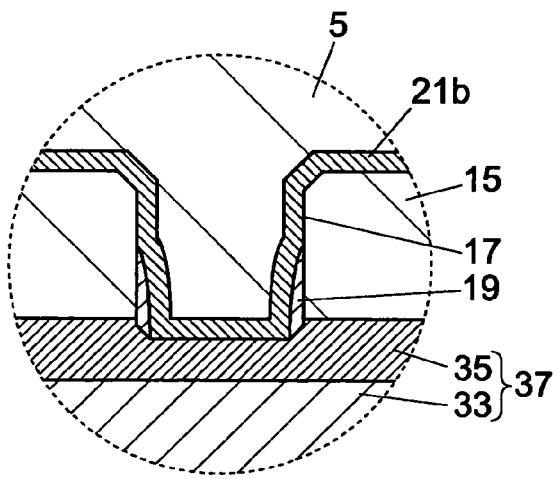
FIG. 17C is an enlarged cross-sectional view of the portion circled by the broken line in FIG. 17B.

FIGS. 17A through 17C illustrate yet another example of the first embodiment. FIG. 17A is a plan view of a part of the formation region of a metal thin-film resistor. FIG. 17B is a cross-sectional view of the structure, taken along the line G-G of FIG. 17A. FIG. 17C is an enlarged cross-sectional view of the portion circled by the broken line of FIG. 17B. In FIG. 17A, the interlayer insulating film is not shown. In FIGS. 17A through 17C, the components having the same functions as those of the foregoing examples are denoted by the same reference numerals as in the foregoing examples, and explanation of them is omitted herein.

A device isolating oxide film 3 is formed on a silicon substrate 1. Polysilicon wiring patterns 37 that consist of polysilicon patterns 33 and refractory metal films 35 are formed on the oxide film (not shown) and the device isolating oxide film 3 formed on the silicon substrate 1. The refractory metal films 35 are made of WSi or TiSi, for example. In the transistor device formation region (not shown), the polysilicon wiring patterns 37 form gate electrodes. Here, sidewalls that are made of an insulating material may be formed on the side surfaces of the polysilicon wiring patterns 37.

A base insulating film 15 is formed on the device isolating oxide film 3 including the formation regions of the polysilicon wiring patterns 37. In the base insulating film 15, step portions are formed by the polysilicon wiring patterns 37.

In the base insulating film 15, connecting holes 17 are also formed at the locations corresponding to the return portions and the end portions of the metal thin-film resistor and the polysilicon wiring pattern 37. As shown in FIG. 17C, the bottom surfaces of the connecting holes 17 are formed by partially removing the refractory metal films 35 on the surface side, and the upper end portion of each connecting hole 17 has a tapered shape. Also, inverse sputtering residues 19 are formed on the inner walls of the connecting holes 17.

A CrSi thin-film resistor 21 that has belt-like portions 21a, return portions 21b, and end portions 21c are formed in a crank-like fashion on the base insulating film 15 including the formation regions of the connecting holes 17.

The belt-like portions 21a are located at a distance from the regions on the polysilicon wiring patterns 37, so that the line width of each belt-like portion 21a is not affected by the step portions formed in the base insulating film 15 due to the existence of the polysilicon wiring patterns 37.

The return portions 21b and the end portions 21c are formed at the ends of the belt-like portions 21a in the connecting holes 17 via the step portions of the base insulating film 16 and the regions on the polysilicon wiring patterns 37. The return portions 21b and the end portions 21c are electrically connected to the metal wiring patterns 37 in the connecting holes 17.

An interlayer insulating film 5 is formed on the base insulating film 15 including the formation region of the CrSi thin-film resistor 21. Although not shown in the drawings, metal wiring patterns and a passivation film are formed on the interlayer insulating film 5. In the case of a multi-layer metal wiring structure, another interlayer insulating film and multi-layer metal wiring patterns are also formed on the interlayer insulating film 5.

Referring to FIGS. 17A through 17C, an example of the method of manufacturing this example is described.

The device isolating oxide film 3 is formed on the silicon substrate 1, and an oxide film such as the gate oxide film of the transistor (not shown) is formed on the surface of the silicon substrate 1 without the device isolating oxide film 3. After that, a low-resistance polysilicon film is formed on the entire surface of the silicon substrate 1, and a refractory metal film is formed on the polysilicon film. The polysilicon film and the refractory metal film are then patterned to form the polysilicon wiring patterns 37 consisting of the polysilicon patterns 33 and the refractory metal films 35. At this point, the gate electrode of the transistor is formed at the same time as the formation of the polysilicon wiring patterns 37. Also, after the polysilicon patterns 33 are formed, the polysilicon wiring patterns 37 may have sidewalls formed on the side surfaces, and have the refractory metal films 35 formed on the upper surfaces of the polysilicon patterns 33 by a salicide process.

The procedures following the above procedures are the same as the procedures 2) through 5) illustrated in FIGS. 2B through 2D and FIGS. 1A through 1C. After the CrSi thin-film resistor 21 is formed, the insulating film to be formed on the CrSi thin-film resistor 21 and the base insulating film 15 is the interlayer insulating film 5.

As described above, in the first embodiment, the polysilicon wiring patterns 37 for establishing electric connection with the CrSi thin-film resistor 21 can be employed in place of the metal wiring patterns 11 shown in FIGS. 1A through 1C, so as to achieve the same effects as the example structure illustrated in FIGS. 1A through 1C.

Figure 18A:
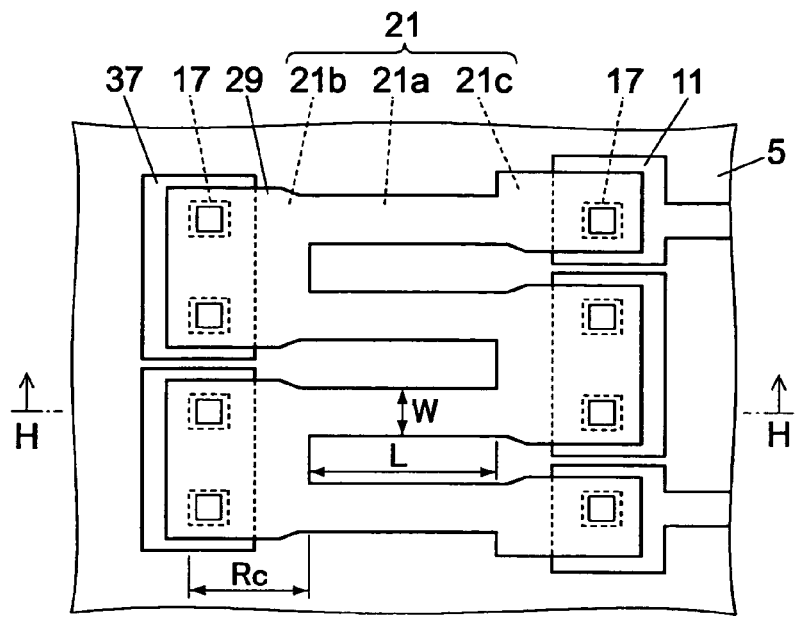
FIG. 18A is a plan view illustrating a part of the formation region of the metal thin-film resistor of still another example structure of the first embodiment of the present invention.
Figure 18B:
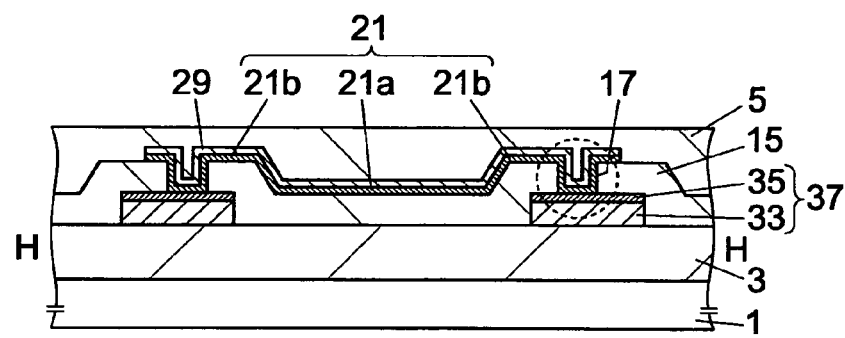
FIG. 18B is a cross-sectional view of the structure, taken along the line H-H of FIG. 18A.
Figure 18C:
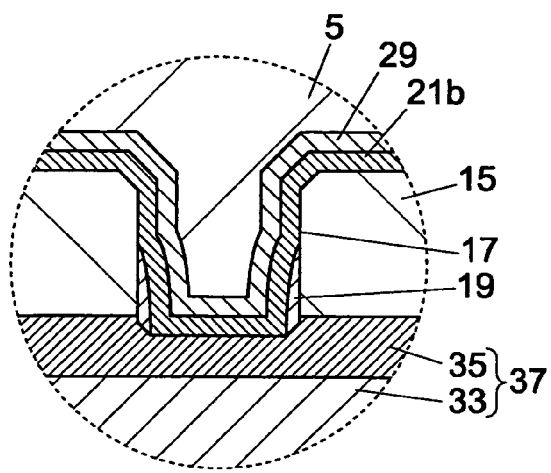
FIG. 18C is an enlarged cross-sectional view of the portion circled by the broken line in FIG. 18B.

Also, as shown in FIGS. 18A through 18C, a CrSiN film 29 may be provided on the upper surface of the CrSi thin-film resistor 21, as in the example illustrated in FIGS. 10A through 10C. With the CrSiN film 29, the upper surface of the CrSi thin-film resistor 21 can be prevented from being exposed to the air, and accordingly, the resistance of the CrSi thin-film resistor 21 can be prevented from varying.

Figure 19A:
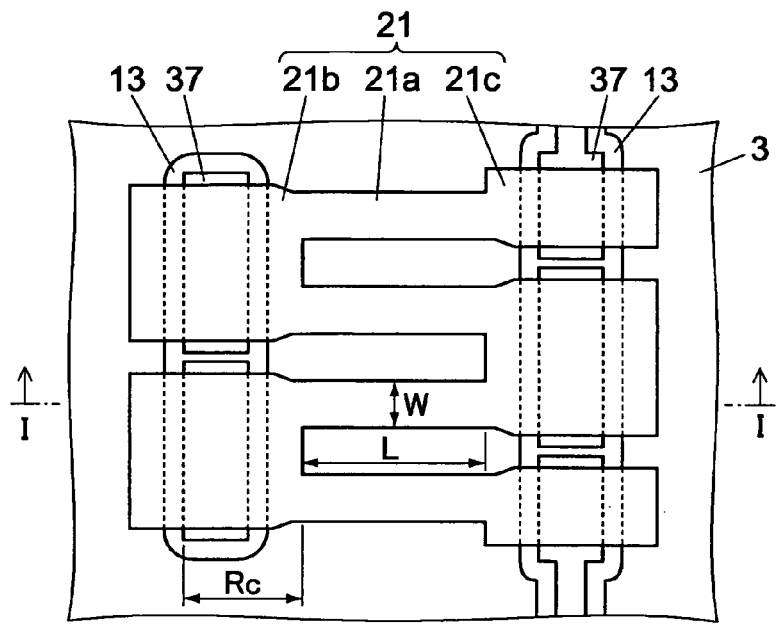
FIG. 19A is a plan view illustrating a part of the formation region of the metal thin-film resistor of yet another example structure of the second embodiment of the present invention.
Figure 19B:
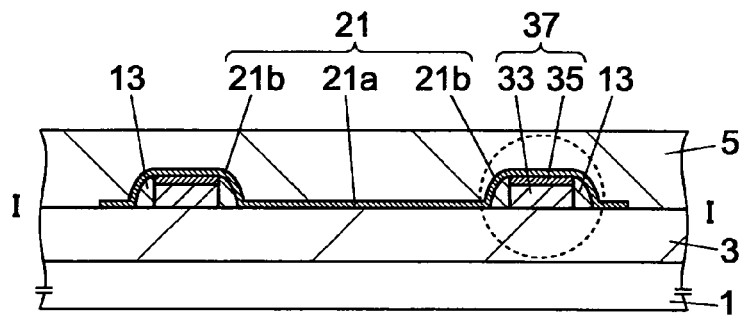
FIG. 19B is a cross-sectional view of the structure, taken along the line I-I of FIG. 19A.
Figure 19C:
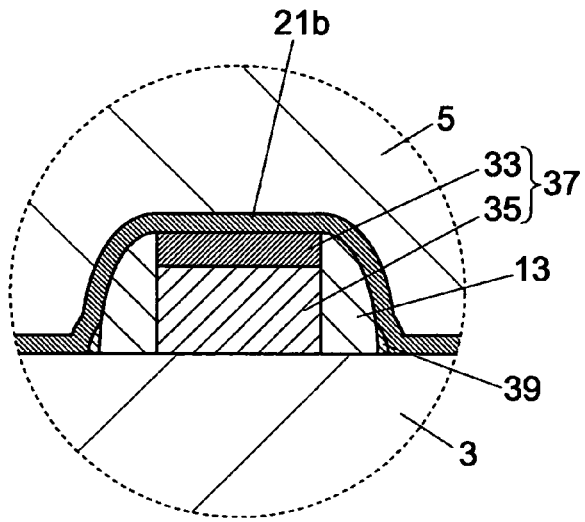
FIG. 19C is an enlarged cross-sectional view of the portion circled by the broken line in FIG. 19B.

FIGS. 19A through 19C illustrate yet another example of the second embodiment. FIG. 19A is a plan view of a part of the formation region of a metal thin-film resistor. FIG. 19B is a cross-sectional view of the structure, taken along the line I-I of FIG. 19A. FIG. 19C is an enlarged cross-sectional view of the portion circled by the broken line of FIG. 19B. In FIG. 19A, the interlayer insulating film is not shown. In FIGS. 19A through 19C, the components having the same functions as those of the foregoing examples are denoted by the same reference numerals as in the foregoing examples, and explanation of them is omitted herein.

A device isolating oxide film 3 is formed on a silicon substrate 1. Polysilicon wiring patterns 37 that consist of polysilicon patterns 33 and refractory metal films 35 are formed on the oxide film (not shown) and the device isolating oxide film 3 formed on the silicon substrate 1.

Sidewalls 13 that are made of an insulating material such as CVD oxide film are formed on the side surfaces of the polysilicon wiring patterns 37. Inverse sputtering residues 39 (not shown in FIGS. 19A and 19B) are formed on the surfaces of the sidewalls 13 on the side of the device isolating oxide film 3. The inverse sputtering residues 39 are formed by performing Ar sputter-etching on the device isolating oxide film 3 after the formation of the polysilicon wiring patterns 37 and the sidewalls 13. The components of the inverse sputtering residues 39 include the materials of the device isolating oxide film 3 and the sidewalls 13 as well as Ar.

A CrSi thin-film resistor 21 that has belt-like portions 21a, return portions 21b, and end portions 21c is formed in a crank-like fashion on the device isolating oxide film 3 including part of the formation regions of the polysilicon wiring patterns 37, the sidewalls 13, and the inverse sputtering residues 39. In this example, the device isolating oxide film 3 serves as the base insulating film for the CrSi thin-film resistor 21.

The belt-like portions 21a are located at a distance from the polysilicon wiring patterns 37, so that the line width of each belt-like portion 21a is not affected by the polysilicon wiring patterns 37.

The return portions 21b and the end portions 21c continue from the belt-like portions 21a, and extend onto the device isolating oxide film 3 via the surfaces of the sidewalls 13 and the inverse sputtering residues 39 formed on side surfaces of the polysilicon wiring patterns 37, the upper surfaces of the polysilicon wiring patterns 37, and the surfaces of the sidewalls 13 and the inverse sputtering residues 39 formed on the other side surfaces of the polysilicon wiring patterns 37. The return portions 21b and the end portions 21c intersect the polysilicon wiring patterns 37.

An interlayer insulating film 5 is formed on the device isolating oxide film 3 including the formation region of the CrSi thin-film resistor 21. Although not shown in the drawings, metal wiring patterns and a passivation film are formed on the interlayer insulating film 5. In the case of a multi-layer metal wiring structure, another interlayer insulating film and multi-layer metal wiring patterns are also formed on the interlayer insulating film 5.

Referring to FIGS. 19A through 19C, an example of the method of manufacturing this example is described.

The device isolating oxide film 3 is formed on the silicon substrate 1, and an oxide film such as the gate oxide film of the transistor (not shown) is formed on the surface of the silicon substrate 1 without the device isolating oxide film 3. After that, a low-resistance polysilicon film is formed on the entire surface of the silicon substrate 1, and a refractory metal film is formed on the polysilicon film. The polysilicon film and the refractory metal film are then patterned to form the polysilicon wiring patterns 37 consisting of the polysilicon patterns 33 and the refractory metal films 35. At this point, the gate electrode of the transistor is formed at the same time as the formation of the polysilicon wiring patterns 37. The sidewalls 13 are then formed on the side surfaces of the polysilicon wiring patterns 37 in the same manner as in the procedure 2) illustrated in FIG. 13B.

The polysilicon wiring patterns 37 and the sidewalls 13 may also be formed in the following manner. After the formation of the polysilicon patterns 33, the sidewalls 13 are formed on the side surfaces of the polysilicon patterns 33. The refractory metal films 35 are then formed on the upper surfaces of the polysilicon patterns 33 through a salicide process.

In this manner, the polysilicon wiring patterns 37 and the sidewalls 13 are formed at the same time as the formation of the gate electrode of the transistor, so as to prevent an increase in the number of manufacturing procedures.

The procedures following the above procedures are the same as the procedures 3) and 4) illustrated in FIGS. 13C and 13D and FIGS. 12A through 12C. After the CrSi thin-film resistor 21 is formed, the insulating film to be formed on the CrSi thin-film resistor 21 and the device isolating oxide film 3 is the interlayer insulating film 5.

As described above, in the second embodiment, the polysilicon wiring patterns 37 for establishing electric connection with the CrSi thin-film resistor 21 can be employed in place of the metal wiring patterns 11 shown in FIGS. 12A through 12C, so as to achieve the same effects as the example structure illustrated in FIGS. 12A through 12C.

Figure 20A:
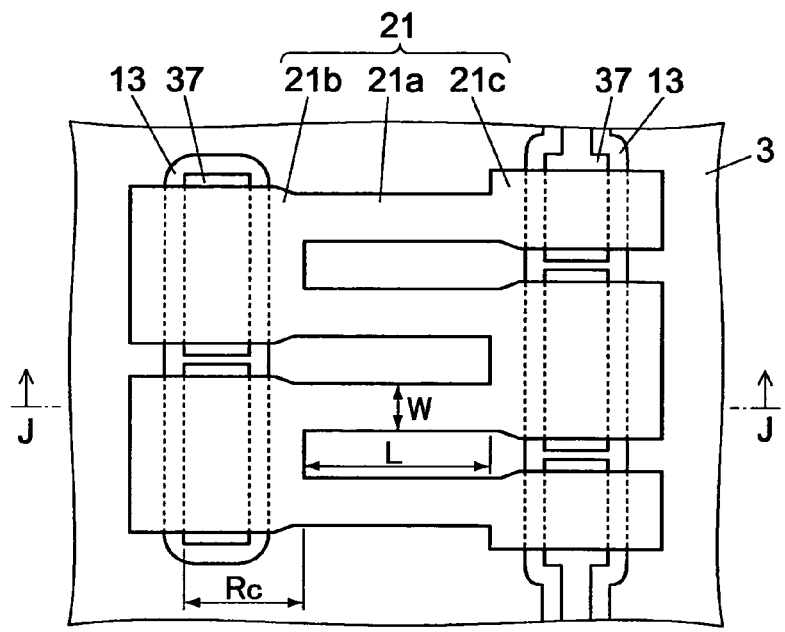
FIG. 20A is a plan view illustrating a part of the formation region of the metal thin-film resistor of still another example structure of the second embodiment of the present invention.
Figure 20B:
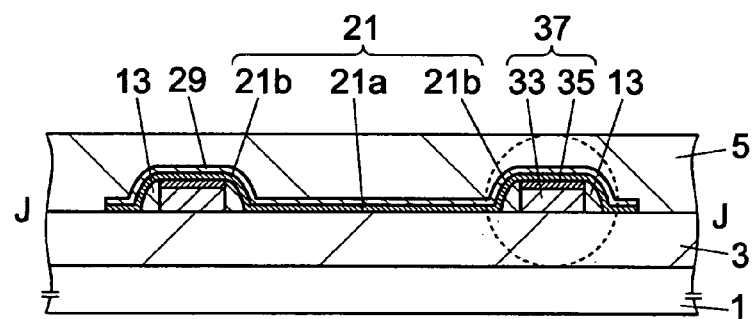
FIG. 20B is a cross-sectional view of the structure, taken along the line J-J of FIG. 20A.
Figure 20C:
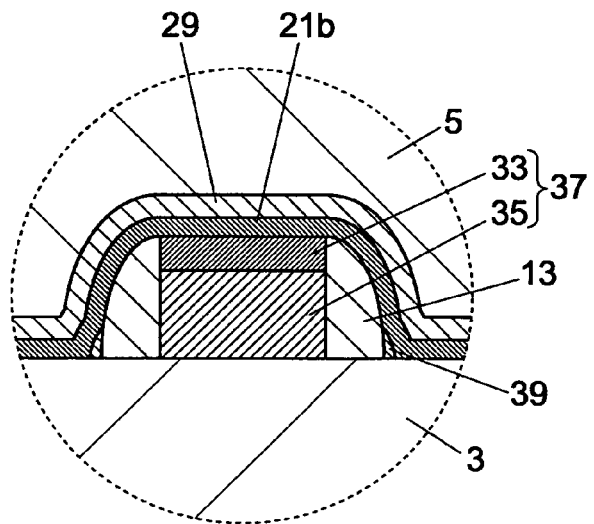
FIG. 20C is an enlarged cross-sectional view of the portion circled by the broken line in FIG. 20B.

Also, as shown in FIGS. 20A through 20C, a CrSiN film 29 may be provided on the upper surface of the CrSi thin-film resistor 21, as in the example illustrated in FIGS. 10A through 10C. With the CrSiN film 29, the upper surface of the CrSi thin-film resistor 21 can be prevented from being exposed to the air, and accordingly, the resistance of the CrSi thin-film resistor 21 can be prevented from varying.

In the examples illustrated in FIGS. 17A through 20C, the polysilicon wiring patterns 37 have the refractory metal films 35 formed on the upper surfaces of the polysilicon patterns 33 or the upper surfaces and side surfaces of the polysilicon patterns 33. However, the present invention is not limited to those structures, and the polysilicon wiring patterns 37 may include only the polysilicon patterns 33.

In the two examples illustrated in FIGS. 19A through 20C, the sidewalls 13 are provided on the side surfaces of the polysilicon wiring patterns 37. However, it is possible to employ structures that do not have sidewalls formed on the side surfaces of the polysilicon wiring patterns 37, as shown in FIGS. 21A through 22C.

In FIGS. 21A through 22C, reference numeral 41 indicates inverse sputtering residues that are formed by performing Ar inverse sputtering immediately before the formation of a CrSi thin film for forming the CrSi thin-film resistor 21. The inverse sputtering residues 41 contain at least the materials of the refractory metal films 35 and the device isolating oxide film 3 as well as Ar. Also, the upper end portions of the refractory metal films 35 are tapered through the Ar inverse sputtering. In both examples illustrated in FIGS. 21A through 22C, the effect of improving the step coverage of the CrSi thin-film resistor 21 cannot be achieved, because the sidewalls 13 are not employed. However, the tapered portions of the refractory metal films 35 and the inverse sputtering residues 41 serve to improve the step coverage of the return portions 21b and the end portions 21c of the CrSi resistor 21. Also, the base film dependency of the CrSi thin-film resistor 21 is reduced by performing the Ar inverse sputtering immediately before the formation of the CrSi thin film for forming the CrSi thin-film resistor 21.

Figure 21A:
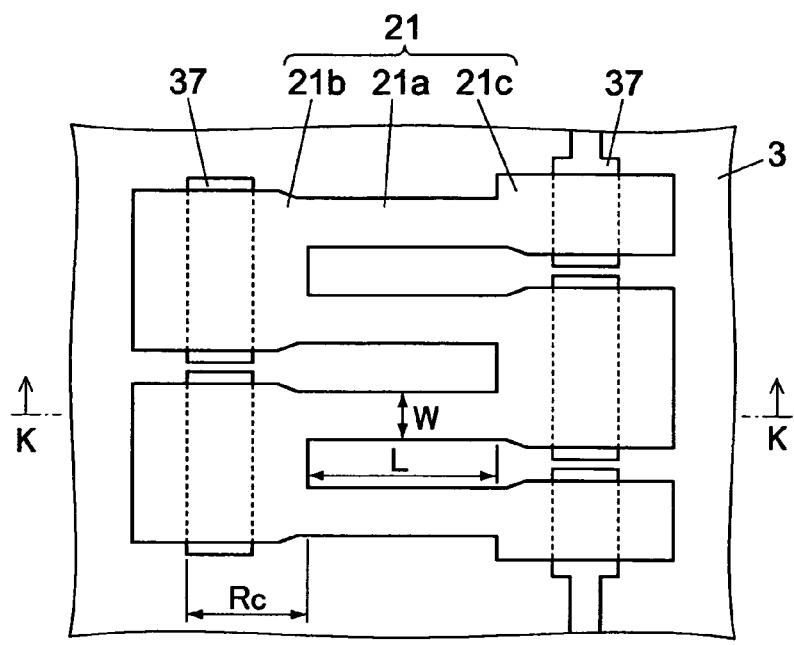
FIG. 21A is a plan view illustrating a part of the formation region of the metal thin-film resistor of yet another example structure of the second embodiment of the present invention.
Figure 21B:
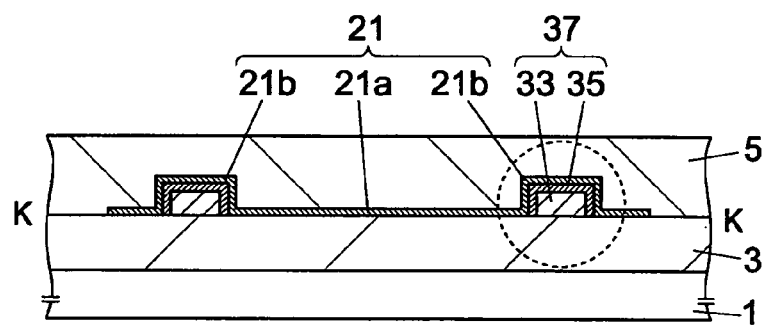
FIG. 21B is a cross-sectional view of the structure, taken along the line K-K of FIG. 21A.
Figure 21C:
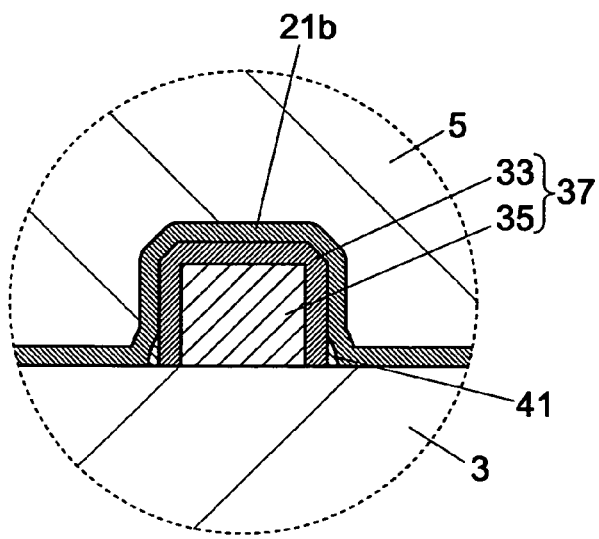
FIG. 21C is an enlarged cross-sectional view of the portion circled by the broken line in FIG. 21B.

The example structure illustrated in FIGS. 21A through 21C can be formed by the same manufacturing procedures as the procedures for manufacturing the structure illustrated in FIGS. 19A through 19C minus the procedure for forming the sidewalls 13. Also, the example structure illustrated in FIGS. 22A through 22C can be formed by the same manufacturing procedures as the procedures for manufacturing the structure illustrated in FIGS. 20A through 20C minus the procedure for forming the sidewalls 13.

Figure 22A:
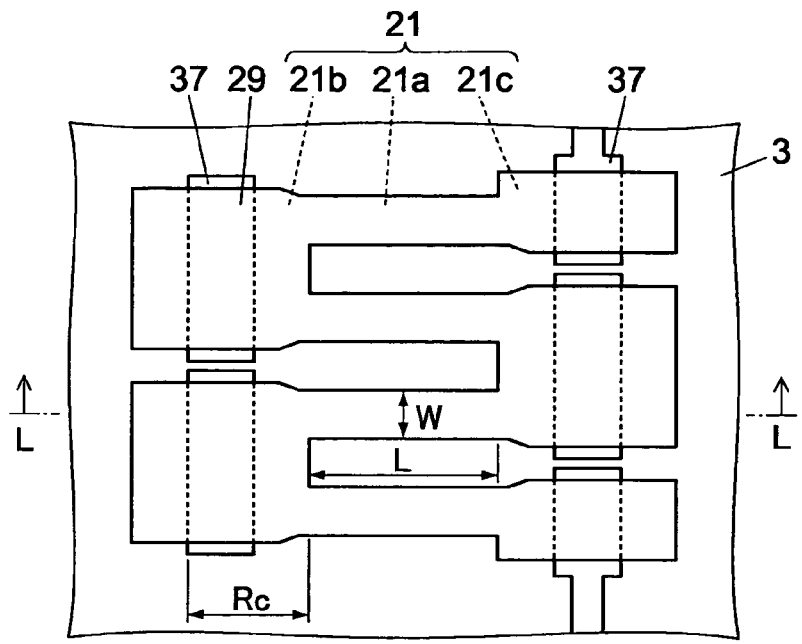
FIG. 22A is a plan view illustrating a part of the formation region of the metal thin-film resistor of still another example structure of the second embodiment of the present invention.
Figure 22B:
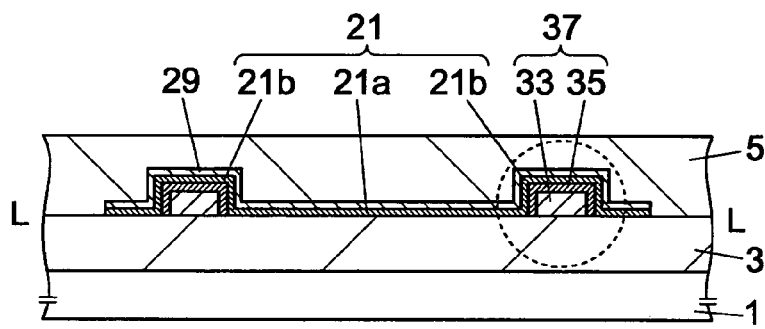
FIG. 22B is a cross-sectional view of the structure, taken along the line L-L of FIG. 22A.
Figure 22C:
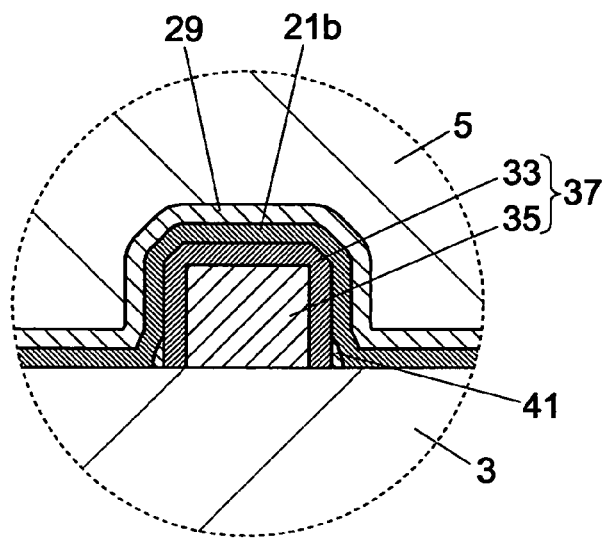
FIG. 22C is an enlarged cross-sectional view of the portion circled by the broken line in FIG. 22B.

Accordingly, the example structure illustrated in FIGS. 21A through 21C can achieve the same effects as the example structure illustrated in FIGS. 19A through 19C, and the example structure illustrated in FIGS. 22A through 22C can achieve the same effects as the example structure illustrated in FIGS. 20A through 20C.

In both examples illustrated in FIGS. 21A through 22C, the refractory metal films 35 of the polysilicon wiring patterns 37 are formed on the upper surfaces and the side surfaces of the polysilicon patterns 33. Such structures can be formed by performing a salicide process after the polysilicon patterns 33 are formed. In this manner, the CrSi thin-film resistor 21 is brought into contact with the polysilicon wiring patterns 37 only through the refractory metal films 35, and the contact resistance can be stabilized.

However, the polysilicon wiring patterns 37 are not limited to the above described arrangement, and the refractory metal films 35 may be formed only on the upper surfaces of the polysilicon patterns 33, as shown in FIGS. 17A through 17C. Also, the polysilicon wiring patterns 37 may not have the refractory metal films 35, and may be formed only with the polysilicon patterns 33. In the case where the polysilicon patterns 37 are formed only with the polysilicon patterns 33, the upper end portions of the polysilicon patterns 33 have tapered shapes that are formed by performing Ar inverse sputtering.

In each of the examples of the second embodiment illustrated in FIGS. 12A through 12C, FIGS. 14A through 16C, and FIGS. 19A through 22C, the return portions 21b and the end portions 21c of the CrSi thin-film resistor 21 intersect the wiring patterns 11 or 37. However, the present invention is not limited to such structures. For example, the ends of the return portions 21b and the end portions 21c may be located on the wiring patterns, or the ends of the wiring patterns may be located under the return portions 21b and the end portions 21c.

Figure 23A:
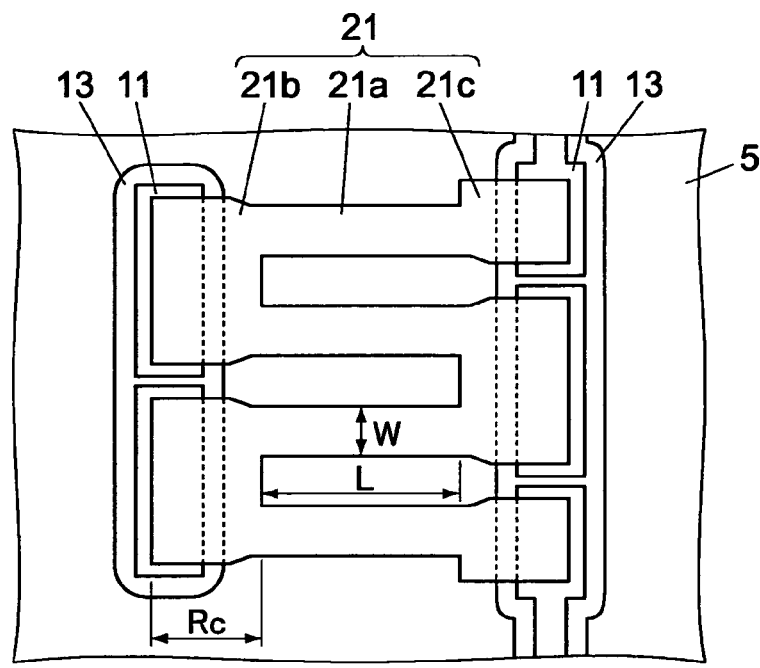
FIGS. 23A and 23B are plan views illustrating the formation regions of the metal thin-film resistor and the metal wiring patterns of yet another example of the first embodiment.
Figure 23B:
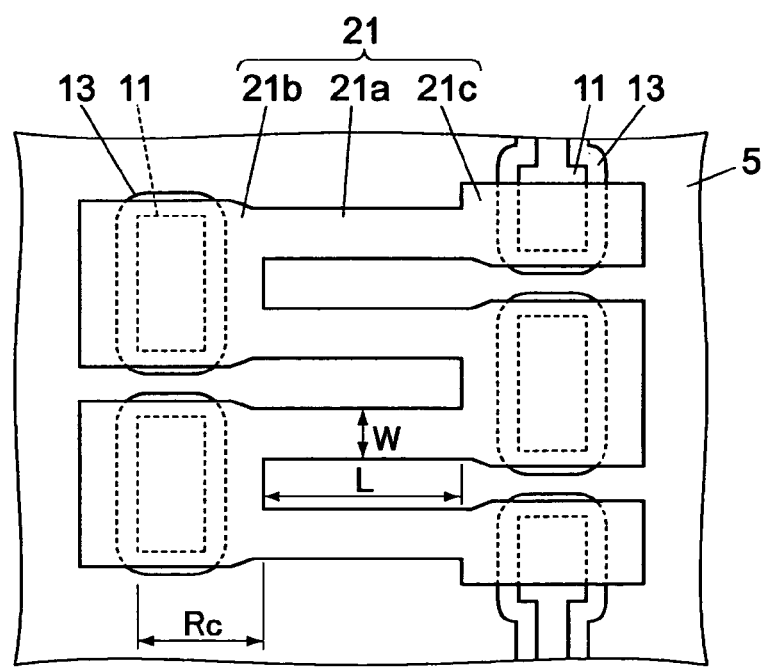

In the structure illustrated in FIGS. 12A through 12C, for instance, the ends of the return portions 21b and the end portions 21c of the CrSi thin-film resistor 21 may be located on the metal wiring patterns 11, as shown in the plan view of FIG. 23A. Alternatively, the ends of the metal wiring patterns 11 may be located under the return portions 21b and the end portions 21c.

In the example structures and samples illustrated in FIGS. 1A through 22C, CrSi is employed as the material for the metal thin-film resistors. However, the present invention is not limited to CrSi thin-film resistors. Examples of the materials for metal thin-film resistors include NiCr, TaN, $CrSi_2$, CrSiN, CrSi, and CrSiO.

Each metal thin-film resistor of a semiconductor device in accordance with the present invention can be applied to a semiconductor device that has an analog circuit. In the following, examples of semiconductor devices each having an analog circuit that includes a metal thin-film resistor of the present invention are described.

Figure 24:
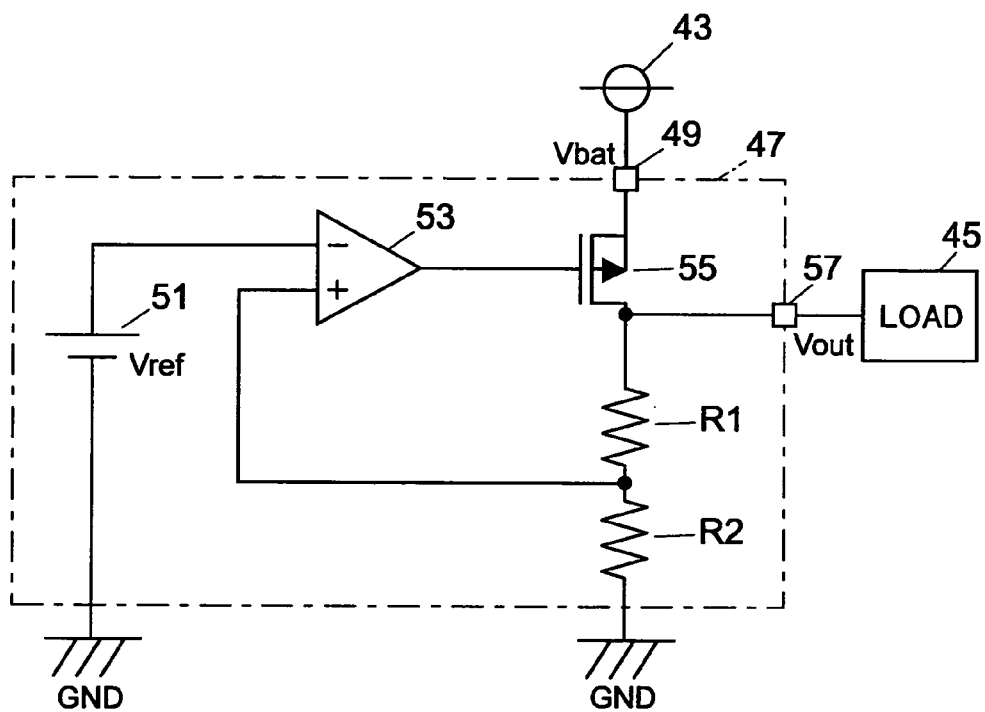
FIG. 24 is a circuit diagram illustrating an example of a semiconductor device with a constant voltage generating circuit that is an analog circuit.

FIG. 24 is a circuit diagram illustrating an example of a semiconductor device with a constant voltage generating circuit that is an analog circuit.

A constant voltage generating circuit 47 is employed to constantly supply power from a DC power supply 43 to a load 45. The constant voltage generating circuit 47 includes an input terminal (Vbat) 49, a reference voltage generating circuit (Vref) 51, an operation amplifier (a comparator circuit) 53, a p-channel MOS transistor (hereinafter referred to simply as PMOS) 55 that forms an output driver, dividing resistive elements R1 and R2, and an output terminal (Vout) 57.

The output terminal of the operation amplifier 53 of the constant voltage generating circuit 47 is connected to the gate electrode of the PMOS 55. A reference voltage Vref is supplied from the reference voltage generating circuit 51 to the inverting input terminal (−) of the operation amplifier 53, and a voltage obtained by dividing an output voltage Vout by the resistance elements R1 and R2 is supplied to the non-inverting input terminal (+). The voltage divided by the resistance elements R1 and R2 is controlled to be equal to the reference voltage Vref.

Figure 25:
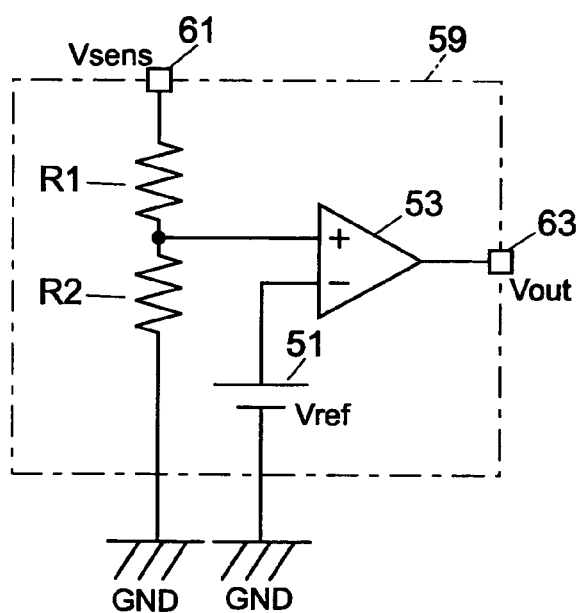
FIG. 25 is a circuit diagram illustrating an example of a semiconductor device with a voltage detecting circuit that is an analog circuit.

FIG. 25 is a circuit diagram illustrating an example of a semiconductor device with a voltage detecting circuit that is an analog circuit.

In a voltage detecting circuit 59, the inverting input terminal (−) of an operation amplifier 53 is connected to a reference voltage generating circuit 51, so that a reference voltage Vref is applied to the inverting input terminal (−) of the operation amplifier 53. The voltage of a terminal to be measured that is input from an input terminal (Vsens) 61 is divided by the dividing resistance elements R1 and R2, and the divided voltage is input to the non-inverting input terminal (+) of the operation amplifier 53. The output of the operation amplifier 53 is output to the outside via an output terminal (Vout) 63.

In the voltage detecting circuit 59, when the voltage of the terminal to be measured is high and the voltage divided by the dividing resistive elements R1 and R2 is higher than the reference voltage Vref, the output of the operation amplifier 53 is maintained at H level. When the voltage of the terminal to be measured drops and the voltage divided by the dividing resistive elements R1 and R2 becomes equal to or lower than the reference voltage Vref, the output of the operation amplifier 53 switches to L level.

In general, in the constant voltage generating circuit shown in FIG. 24 and the voltage detecting circuit shown in FIG. 25, the reference voltage Vref supplied from the reference voltage generating circuit varies due to the variation in manufacturing processes. Therefore, to accommodate the variation, resistive element circuits (also referred to as dividing resistive circuits) that can adjust the resistance by cutting a fuse element or dividing resistive circuits that can adjust the resistance through laser irradiation onto resistive elements are used to adjust the resistance values of the dividing resistive elements.

Figure 26:
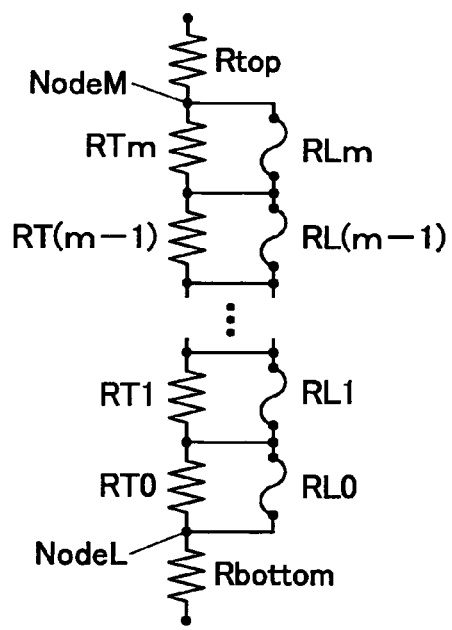
FIG. 26 is a circuit diagram illustrating an example of a semiconductor device with a dividing resistive circuit that is an analog circuit.

FIG. 26 is a circuit diagram illustrating an example of a dividing resistive circuit in which metal thin-film resistors of the present invention are employed.

Figure 27:
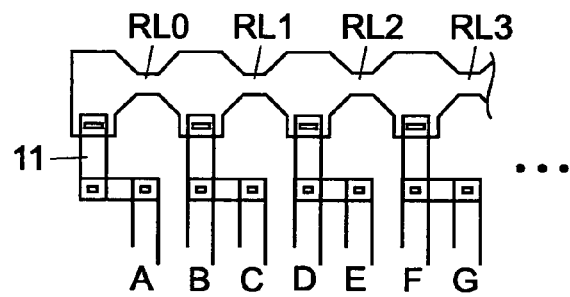
FIG. 27 illustrates an example of the arrangement of fuse elements in the dividing resistive circuit.
Figure 28:
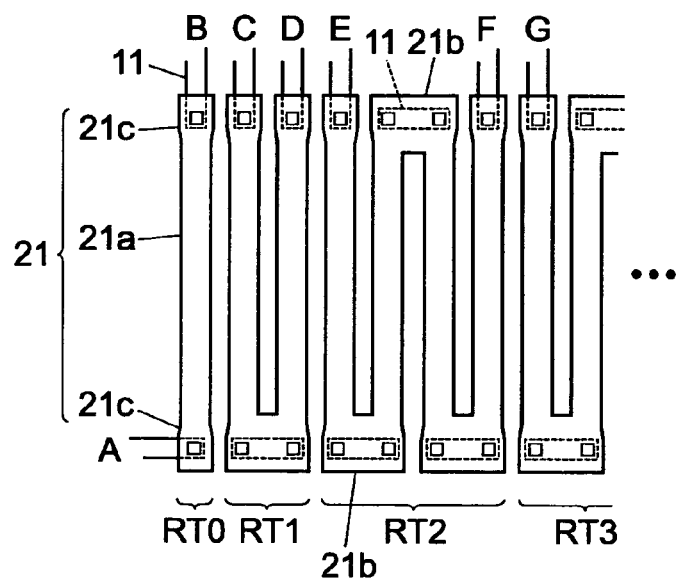
FIG. 28 illustrates an example of the arrangement of the metal thin-film resistors in the dividing resistive circuit.

FIG. 27 illustrates an example of the arrangement of the fuse elements in the dividing resistive circuit. FIG. 28 illustrates an example of the arrangement of the resistive elements in the dividing resistive circuit.

As shown in FIG. 26, a resistive element Rbottom, m+1 (m being a positive integer) of resistive elements RT0, RT1, . . . , RTm, and a resistive element Rtop are connected in series. Fuse elements RL0, RL1, . . . , RLm are parallel-connected to the respective resistive elements RT0, RT1, . . . , RTm.

As shown in FIG. 27, the fuse elements RL0, RL1, . . . , RLm are formed with polysilicon patterns each having a sheet resistance of 20 Ω to 40Ω.

The value of each of the resistive elements RT0, RT1, . . . , RTm becomes greater in a binary fashion from the side of the resistive element Rbottom. More specifically, the resistance value of the resistive element RTn is 2n times as great as the unit value that is the resistance value of the resistive element RT0.

For example, CrSi thin-film resistors 21 having belt-like portions 21a, return portions 21b, and end portions 21c are employed, as shown in FIG. 28. In this structure, the resistive element RT0 is formed with a single CrSi thin-film resistor 21 as the unit resistance, and the resistive element RTn is formed with 2n of CrSi thin-film resistors 21. The CrSi thin-film resistors 21 may be the same ones as the structure illustrated in FIGS. 1A through 1C, for example. The resistance values of the resistive elements RT0, RT1, . . . , RTm can be calculated using the above equation 1). It is of course possible to employ any CrSi thin-film resistor 21 other than the structure illustrated in FIGS. 1A through 1C.

In FIGS. 27 and 28, the portions indicated by A-A, the portions indicated by B-B, the portions indicated by C-C, the portions indicated by D-D, the portions indicated by E-E, the portions indicated by F-F, and the portions indicated by G-G are electrically connected with the metal wiring patterns 11.

In the dividing resistive circuit that puts emphasis on the accuracy of the ratio of resistive elements, unit resistive elements each having a resistive element and a fuse element are connected in series and are arranged in a ladder-like fashion, so as to increase the accuracy of the products in the manufacturing procedures.

In such a dividing resistive circuit, any of the fuse elements RL0, RL1, . . . , RLm is cut with a laser beam, thereby obtaining desired series resistance.

As described above, the resistive elements can be stabilized with the metal thin-film resistors of semiconductor devices in accordance with the present invention. Thus, the accuracy of the output voltage of the dividing resistive circuit shown in FIG. 26 can be increased.

In a case where the dividing resistive circuit shown in FIG. 26 is applied to the dividing resistive elements R1 and R2 of the constant voltage generating circuit 47 shown in FIG. 24, an end of the resistive element Rbottom is grounded, and an end of the resistive element Rtop is connected to the drain of the PMOS 55. Further, a terminal NodeL between the resistive element Rbottom and the resistive element RT0, or a terminal NodeM between the resistive element Rtop and the resistive element RTm, is connected to the non-inverting input terminal of the operation amplifier 53.

With the dividing resistive circuit to which the present invention is applied, the accuracy of the output voltage of the dividing resistive circuit can be increased. Thus, the output voltage of the constant voltage generating circuit 47 can be stabilized.

In a case where the dividing resistive circuit shown in FIG. 26 is applied to the dividing resistive elements R1 and R2 of the voltage detecting circuit 59 shown in FIG. 25, an end of the resistive element Rbottom is grounded, and an end of the resistive element Rtop is connected to the input terminal 61. Further, a terminal NodeL between the resistive element Rbottom and the resistive element RT0, or a terminal NodeM between the resistive element Rtop and the resistive element RTm, is connected to the non-inverting input terminal of the operation amplifier 53.

With the dividing resistive circuit to which the present invention is applied, the accuracy of the output voltage of the dividing resistive circuit can be increased. Thus, the accuracy of the voltage detection by the voltage detecting circuit 59 can be increased.

Examples of semiconductor devices in which dividing resistive circuits having metal thin-film resistors of the present invention are employed have been described, with reference to FIGS. 24 through 28. However, it is not limited to the semiconductor devices having the above described constant voltage generating circuit or the voltage detecting circuit. Rather, the metal thin-film resistors of the present invention can be applied to any semiconductor device having a dividing resistive circuit.

Also, semiconductor devices in which metal thin-film resistor of the present invention are employed are not limited to those with dividing resistive circuits. The present invention can be applied to any semiconductor device having metal thin-film resistors. For example, a metal thin-film resistor in accordance with the present invention can be used as a resistor for adjusting a resistance value by cutting or altering the resistor through laser beam irradiation thereon.

It should be noted that the present invention is not limited to the embodiments specifically disclosed above, but other variations and modifications may be made without departing from the scope of the present invention.

This patent application is based on Japanese Priority Patent Application No. 2004-084144, filed on Mar. 23, 2004, the entire contents of which are hereby incorporated by reference.

What is claimed is:

1. A semiconductor device comprising:
   a base insulating film;
   a metal thin-film resistor that is provided on the base insulating film;
   a lower-layer insulating film that is formed under the base insulating film; and
   a wiring pattern that is formed on the lower-layer insulating film,
   wherein: the base insulating film is formed on the lower-layer insulating film and the wiring pattern, a connecting hole being formed in the base insulating film located on the wiring pattern;
   the metal thin-film resistor has at least two belt-like portions and a return portion that continues to the belt-like portions;
   the belt-like portions are located at a distance from the region on the wiring pattern; and
   the return portion connects the at least two belt-like portions in a position at a distance from the region on the wiring pattern, and is formed in the connecting hole via the region on the wiring pattern.

2. The semiconductor device as claimed in claim 1, wherein the wiring pattern is formed with a metal material pattern and a refractory metal film that is formed at least on the upper surface of the metal material pattern.

3. The semiconductor device as claimed in claim 1, wherein the wiring pattern is formed with a polysilicon pattern and a refractory metal film that is formed at least on the upper surface of the polysilicon pattern.

4. The semiconductor device as claimed in claim 1, further comprising
   a metal nitride film that covers the upper surface of the metal thin-film resistor,
   wherein a metal oxide film is not formed between the upper surface of the metal thin-film resistor and the metal nitride film.

5. A semiconductor device comprising: a base insulating film; a metal thin-film resistor that is provided on the base insulating film; a lower-layer insulating film that is formed under the base insulating film; and a wiring pattern that is formed on the lower-layer insulating film, wherein: the base insulating film is formed on the lower-layer insulating film and the wiring pattern, a connecting hole being formed in the base insulating film located on the wiring pattern; the metal thin-film resistor has at least two belt-like portions and a return portion that continues to the belt-like portions; the belt-like portions are located at a distance from the region on the wiring pattern; and the return portion connects the at least two belt-like portions in a position at a distance from the region on the wiring pattern, and is formed in the connecting hole via the region on the wiring pattern; and
   wherein: at least the upper end portion of the connecting hole has a tapered shape; and
   an inverse sputtering residue containing at least the materials of the wiring pattern and the base insulating film and Ar is formed on the inner wall of the connecting hole.

6. A semiconductor device comprising: a base insulating film; a metal thin-film resistor that is provided on the base insulating film; a lower-layer insulating film that is formed under the base insulating film; and a wiring pattern that is formed on the lower-layer insulating film, wherein: the base insulating film is formed on the lower-layer insulating film and the wiring pattern, a connecting hole being formed in the base insulating film located on the wiring pattern; and
   wherein at least the upper end portion of the connecting hole has a tapered shape; and an inverse sputtering residue containing at least the materials of the wiring pattern and the base insulating film and Ar is formed on the inner wall of the connecting hole.

* * * * *